(12) United States Patent
LaVoie et al.

(10) Patent No.: US 9,611,544 B2
(45) Date of Patent: Apr. 4, 2017

(54) PLASMA ACTIVATED CONFORMAL DIELECTRIC FILM DEPOSITION

(75) Inventors: Adrien LaVoie, Portland, OR (US); Mandyam Sriram, Beaverton, OR (US)

(73) Assignee: Novellus Systems, Inc., Fremont, CA (US)

( * ) Notice: Subject to any disclaimer, the term of this patent is extended or adjusted under 35 U.S.C. 154(b) by 855 days.

(21) Appl. No.: 13/224,240

(22) Filed: Sep. 1, 2011

(65) Prior Publication Data

US 2012/0009802 A1    Jan. 12, 2012

Related U.S. Application Data

(63) Continuation-in-part of application No. 13/084,399, filed on Apr. 11, 2011, which is a continuation-in-part of application No. 13/084,305, filed on Apr. 11, 2011.

(60) Provisional application No. 61/324,710, filed on Apr. 15, 2010, provisional application No. 61/372,367, filed on Aug. 10, 2010, provisional application No.
(Continued)

(51) Int. Cl.
| | |
|---|---|
| C23C 16/04 | (2006.01) |
| C23C 16/455 | (2006.01) |
| C23C 16/34 | (2006.01) |
| C23C 16/40 | (2006.01) |
| C23C 16/56 | (2006.01) |
| H01L 21/02 | (2006.01) |

(Continued)

(52) U.S. Cl.
CPC .......... *C23C 16/045* (2013.01); *C23C 16/345* (2013.01); *C23C 16/402* (2013.01); *C23C 16/4554* (2013.01); *C23C 16/45523* (2013.01); *C23C 16/45529* (2013.01); *C23C 16/56* (2013.01); *H01L 21/0217* (2013.01); *H01L 21/0228* (2013.01); *H01L 21/02126* (2013.01); *H01L 21/02164* (2013.01); *H01L 21/02274* (2013.01); *H01L 21/02348* (2013.01); *H01L 21/76224* (2013.01); *H01L 21/76898* (2013.01)

(58) Field of Classification Search
CPC ............ H01L 21/0217; H01L 21/0228; C23C 16/45525–16/45542
USPC ....................................................... 438/784
See application file for complete search history.

(56) References Cited

U.S. PATENT DOCUMENTS

| | | |
|---|---|---|
| 4,500,563 A | 2/1985 | Ellenberger et al. |
| 5,223,443 A | 6/1993 | Chinn et al. |
| | (Continued) | |

FOREIGN PATENT DOCUMENTS

| | | |
|---|---|---|
| CN | 1732288 A | 2/2006 |
| CN | 1926668 A | 3/2007 |
| | (Continued) | |

OTHER PUBLICATIONS

International Search Report and Written Opinion, dated Feb. 20, 2012, issued in PCT/US2011/032303.

(Continued)

*Primary Examiner* — Bryan Junge
(74) *Attorney, Agent, or Firm* — Weaver Austin Villeneuve & Sampson LLP

(57) ABSTRACT

Methods of depositing a film on a substrate surface include surface mediated reactions in which a film is grown over one or more cycles of reactant adsorption and reaction. In one aspect, the method is characterized by intermittent delivery of dopant species to the film between the cycles of adsorption and reaction.

44 Claims, 18 Drawing Sheets

Related U.S. Application Data

61/379,081, filed on Sep. 1, 2010, provisional application No. 61/417,807, filed on Nov. 29, 2010.

(51) Int. Cl.
 H01L 21/768 (2006.01)
 H01L 21/762 (2006.01)

(56) References Cited

U.S. PATENT DOCUMENTS

| | | |
|---|---|---|
| 5,496,608 A | 3/1996 | Matsuda et al. |
| 5,593,914 A | 1/1997 | Evans, Jr. et al. |
| 5,670,432 A | 9/1997 | Tsai |
| 5,856,003 A | 1/1999 | Chiu |
| 5,874,368 A | 2/1999 | Laxman et al. |
| 5,932,286 A | 8/1999 | Beinglass et al. |
| 6,100,202 A | 8/2000 | Lin et al. |
| 6,218,293 B1 | 4/2001 | Kraus et al. |
| 6,270,572 B1 | 8/2001 | Kim et al. |
| 6,346,741 B1 | 2/2002 | Van Buskirk et al. |
| 6,391,803 B1 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,509,601 B1 | 1/2003 | Lee et al. |
| 6,528,430 B2 | 3/2003 | Kwan et al. |
| 6,551,893 B1 | 4/2003 | Zheng et al. |
| 6,569,501 B2 | 5/2003 | Chiang et al. |
| 6,576,053 B1 | 6/2003 | Kim et al. |
| 6,602,784 B2 | 8/2003 | Sneh |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic et al. |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 * | 8/2005 | Chou et al. ............ 438/786 |
| 6,943,092 B2 | 9/2005 | Kim |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,109,129 B1 | 9/2006 | Papasouliotis |
| 7,115,166 B2 | 10/2006 | Vaartstra et al. |
| 7,115,528 B2 | 10/2006 | Vaartstra et al. |
| 7,122,222 B2 | 10/2006 | Xiao et al. |
| 7,122,464 B2 | 10/2006 | Vaartstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,235,484 B2 | 6/2007 | Nguyen et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 * | 12/2009 | Wan et al. ............ 438/758 |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,758,920 B2 | 7/2010 | Hasebe et al. |
| 7,776,733 B2 | 8/2010 | Hasegawa |
| 7,790,633 B1 | 9/2010 | Tarafdar et al. |
| 7,825,039 B2 | 11/2010 | Takahashi et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,956,983 B2 | 2/2015 | Swaminathan et al. |
| 8,999,859 B2 | 4/2015 | Swaminathan et al. |
| 9,076,646 B2 | 7/2015 | Sims et al. |

(56) References Cited

U.S. PATENT DOCUMENTS

| | | |
|---|---|---|
| 9,214,334 B2 | 12/2015 | Swaminathan et al. |
| 9,230,800 B2 | 1/2016 | Lavoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 2002/0076507 A1 | 6/2002 | Chiang et al. |
| 2003/0008070 A1 | 1/2003 | Seutter et al. |
| 2003/0024477 A1 | 2/2003 | Okuda et al. |
| 2003/0143839 A1 | 7/2003 | Raaijmakers et al. |
| 2003/0200917 A1 | 10/2003 | Vaartstra |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0219746 A1 | 11/2004 | Vaartstra et al. |
| 2004/0231799 A1 | 11/2004 | Lee et al. |
| 2005/0042865 A1 | 2/2005 | Cabral et al. |
| 2005/0079661 A1 | 4/2005 | Cho et al. |
| 2005/0109276 A1 | 5/2005 | Iyer et al. |
| 2005/0118837 A1 | 6/2005 | Todd et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0287775 A1 | 12/2005 | Hasebe et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0199357 A1 | 9/2006 | Wan et al. |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1* | 1/2007 | Matsuura ............. 438/478 |
| 2007/0065576 A1 | 3/2007 | Singh et al. |
| 2007/0087581 A1 | 4/2007 | Singh et al. |
| 2007/0116887 A1 | 5/2007 | Faguet |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0251444 A1 | 11/2007 | Gros et al. |
| 2007/0259110 A1 | 11/2007 | Mahajani et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1* | 4/2008 | Clark ............. C23C 16/345 438/680 |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0213479 A1 | 9/2008 | Chou et al. |
| 2008/0242116 A1 | 10/2008 | Clark |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1* | 2/2009 | Honda ............. 257/59 |
| 2009/0041952 A1 | 2/2009 | Yoon et al. |
| 2009/0065896 A1 | 3/2009 | Hwang et al. |
| 2009/0075490 A1* | 3/2009 | Dussarrat ............. 438/787 |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0191722 A1 | 7/2009 | Hasebe et al. |
| 2009/0203197 A1 | 8/2009 | Hanawa et al. |
| 2009/0208880 A1* | 8/2009 | Nemani et al. ............. 430/323 |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0051578 A1 | 3/2010 | Chang et al. |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102417 A1 | 4/2010 | Ganguli et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0167555 A1 | 7/2010 | Maula et al. |
| 2010/0221925 A1 | 9/2010 | Lee et al. |
| 2010/0255218 A1 | 10/2010 | Oka et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0124187 A1 | 5/2011 | Afzali-Ardakani et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1* | 6/2011 | Matsushita et al. ............. 427/509 |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1 | 3/2012 | Li et al. |
| 2012/0108079 A1 | 5/2012 | Mahajani |
| 2012/0113672 A1 | 5/2012 | Dubrow et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0058161 A1 | 3/2013 | Yamanaka et al. |
| 2013/0058162 A1 | 3/2013 | Yamanaka et al. |
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0252437 A1 | 9/2013 | Sano et al. |
| 2013/0309415 A1 | 11/2013 | Swaminathan et al. |
| 2013/0319329 A1 | 12/2013 | Li et al. |
| 2013/0344248 A1 | 12/2013 | Clark |
| 2014/0030444 A1 | 1/2014 | Swaminathan et al. |
| 2014/0051262 A9 | 2/2014 | Lavoie et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |

(56) References Cited

U.S. PATENT DOCUMENTS

| | | |
|---|---|---|
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0264555 A1 | 9/2014 | Ahn et al. |
| 2014/0273428 A1 | 9/2014 | Shero et al. |
| 2014/0295084 A1 | 10/2014 | Shirai et al. |
| 2014/0302686 A1 | 10/2014 | Pan et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |
| 2016/0020092 A1 | 1/2016 | Kang et al. |
| 2016/0064211 A1 | 3/2016 | Swaminathan et al. |
| 2016/0118246 A1 | 4/2016 | Kang et al. |
| 2016/0148800 A1 | 5/2016 | Henri et al. |
| 2016/0155676 A1 | 6/2016 | Kang et al. |
| 2016/0163539 A9 | 6/2016 | Kang et al. |
| 2016/0163972 A1 | 6/2016 | Swaminathan et al. |
| 2016/0293398 A1 | 10/2016 | Danek et al. |
| 2016/0293838 A1 | 10/2016 | Swaminathan et al. |

FOREIGN PATENT DOCUMENTS

| | | |
|---|---|---|
| CN | 101255548 A | 9/2008 |
| CN | 101378007 A | 3/2009 |
| CN | 101416293 A | 4/2009 |
| CN | 101535524 A | 9/2009 |
| CN | 101889331 A | 11/2010 |
| CN | 103137864 A | 6/2013 |
| EP | 0 277 766 | 8/1988 |
| EP | 0 541 212 | 5/1993 |
| EP | 1 703 552 A2 | 9/2006 |
| EP | 2 278 046 | 1/2011 |
| JP | H02-093071 A | 4/1990 |
| JP | H06-177120 A | 6/1994 |
| JP | 2001-338922 A | 12/2001 |
| JP | 2002-134497 A | 5/2002 |
| JP | 2002-164345 A | 6/2002 |
| JP | 2007-180362 A | 7/2007 |
| JP | 2007-287889 A | 11/2007 |
| JP | 2007-287890 A | 11/2007 |
| JP | 2008-500742 A | 1/2008 |
| JP | 2008-109093 A | 5/2008 |
| JP | 4364320 | 8/2009 |
| JP | 2009-540128 A | 11/2009 |
| JP | 2010-10497 | 1/2010 |
| JP | 2010-245518 A | 10/2010 |
| JP | 2011-023576 A | 2/2011 |
| JP | 2013225655 A | 10/2013 |
| KR | 10-2001-0111448 | 12/2001 |
| KR | 10-2004-0001036 | 1/2004 |
| KR | 10-0734748 B | 7/2007 |
| KR | 10-2009-0057665 | 6/2009 |
| KR | 10-2009-0080019 | 7/2009 |
| KR | 10-2009-0081396 | 7/2009 |
| TW | 201009942 A | 3/2010 |
| TW | 201042706 A1 | 12/2010 |
| WO | WO 2004/032196 | 4/2004 |
| WO | WO 2006/026350 | 3/2006 |
| WO | WO 2006/104741 | 10/2006 |
| WO | WO 2007/043709 | 4/2007 |
| WO | WO 2007/118026 | 10/2007 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/065806 | 5/2013 |
| WO | WO 2013/112727 | 8/2013 |

OTHER PUBLICATIONS

Lee, Jong Ju, Low-impurity, highly conformal atomic layer deposition of titanium nitride using $NH_3$—Ar—$H_2$ plasma treatment for capacitor electrodes, Lawrence Berkeley National Laboratory, University of California, Berkeley, CA (2004).

"PlasmaPro," Oxford Instruments (2010).

Cecchi et al., "Ultra-thin conformal pore-sealing of low-k materials by plasma-assisted ALD," University of New Mexico, Albuquerque, NM, Sandia National Labs, Albuquerque, NM (2007).

Lee et al., "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, Microelectronic Engineering 80 (2005).

Plasma Enhanced Atomic Layer Deposition (PEALD), Website: http://www.asm.com/index.php?option=com_content&task=view&id=19&Itemid=161 (2010).

International Search Report and Written Opinion, dated Oct. 20, 2011, issued in PCT/US2011/032186.

Invitation to Pay Additional Fees; Communication Re Partial International Search, dated Dec. 16, 2011, issued in PCT/US2011/032303.

King, Sean W., "Plasma enhanced atomic layer deposition of $SiN_x$:H and $SiO_2$," J. Vac. Sci. Technol. A 29(4), Jul./Aug. 2011 .

U.S. Appl. No. 13/242,084, filed Sep. 23, 2011, entitled "Plasma Activated Conformal Dielectric Film Deposition".

U.S. Appl. No. 13/963,212, filed Aug. 9, 2013, entitled "Plasma-Activated Deposition of Conformal Films".

U.S. Appl. No. 13/953,616, filed Jul. 29, 2013, entitled "High Pressure, High Power Plasma Activated Conformal Film Deposition".

US Office Action dated Mar. 15, 2013 issued in U.S. Appl. No. 13/084,399.

US Office Action dated Sep. 14, 2012 issued in U.S. Appl. No. 13/084,305.

US Final Office Action dated Apr. 25, 2013 issued in U.S. Appl. No. 13/084,305.

US Office Action dated Apr. 13, 2011 issued in U.S. Appl. No. 12/889,132.

US Notice of Allowance dated Sep. 30, 2011 issued in U.S. Appl. No. 12/889,132.

US Office Action dated Aug. 1, 2012 issued in U.S. Appl. No. 13/011,569.

US Final Office Action dated Feb. 26, 2013 issued in U.S. Appl. No. 13/011,569.

US Notice of Allowance dated May 6, 2013 issued in U.S. Appl. No. 13/011,569.

US Office Action dated Apr. 4, 2013 issued U.S. Appl. No. 13/242,084.

US Notice of Allowance dated Jun. 19, 2013 issued U.S. Appl. No. 13/242,084.

US Office Action dated Jun. 7, 2013 issued U.S. Appl. No. 13/414,619.

US Notice of Allowance dated Jul. 26, 2013, issued U.S. Appl. No. 13/414,619.

US Office Action dated May 24, 2013 issued U.S. Appl. No. 13/472,282.

PCT International Preliminary Report on Patentability dated Oct. 26, 2012, issued in PCT/US2011/032186.

PCT International Preliminary Report on Patentability and Written Opinion, dated Oct. 26, 2012, issued in PCT/US2011/032303.

PCT International Search Report and Written Opinion dated May 2, 2012 issued in Application No. PCT/US2011/052537.

PCT International Preliminary Report on Patentability and Written Opinion dated Apr. 4, 2013 issued in Application No. PCT/US2011/052537.

(56) References Cited

OTHER PUBLICATIONS

PCT International Search Report and Written Opinion dated Dec. 18, 2012, issued in Application No. PCT/US2012/052769.
PCT International Search Report and Written Opinion dated Feb. 28, 2013, issued in Application No. PCT/US2012/051740.
PCT International Search Report and Written Opinion dated May 27, 2013, issued in Application No. PCT/US2013/022977.
Choi, Gyu-Jin et al., (2009) "Plasma-enhanced atomic layer deposition of TiO2 and Al-doped TiO2 films using N2O and O2 reactants," Journal of the Electrochemical Society, 156 ISS, 9 pp, G138-G143.
Man P.F. et al., "Elimination of Post-Release Adhesion in Microstructures Using Conformal Fluorocarbon Coatings," MEMS '96 Proceedings, IEEE Feb. 11-15, 1996, pp. 55-60.
Nguyen, S.V. et al., Plasma-assist chemical vapor deposition of dielectric thin films for ULSI semiconductor circuits, IBM J.Res. Develop. vol. 43, No. 1.2, Jan./Mar. 1999, pp. 5-38.
U.S. Appl. No. 15/224,347, filed Jul. 29, 2016, entitled "Plasma Assisted Atomic Layer Deposition of Multi-Layer Films for Patterning Applications."
U.S. Appl. No. 14/552,011, filed Nov. 24, 2014, entitled "Selective Inhibition in Atomic Layer Deposition of Silicon-Containing Films."
U.S. Appl. No. 15/201,221, filed Jul. 1, 2016, entitled "Selective Atomic Layer Deposition with Post-Dose Treatment."
U.S. Appl. No. 15/253,301, filed Aug. 31, 2016, entitled "Selective Atomic Layer Deposition for Gapfill Using Sacrificial Underlayer."
U.S. Appl. No. 15/199,608, filed Jun. 30, 2016, entitled "Apparatus and Method for Deposition and Etch in Gap Fill."
US Final Office Action dated Sep. 13, 2013 issued in U.S. Appl. No. 13/084,399.
US Notice of Allowance dated Jan. 15, 2014 issued in U.S. Appl. No. 13/084,399.
US Office Action dated Jan. 2, 2015 issued in U.S. Appl. No. 14/231,554.
US Final Office Action dated Jun. 10, 2015 issued in U.S. Appl. No. 14/231,554.
US Notice of Allowance dated Aug. 31, 2015 issued in U.S. Appl. No. 14/231,554.
US Office Action dated Jul. 1, 2016 issued in U.S. Appl. No. 13/963,212.
US Notice of Allowance dated Sep. 19, 2013 issued U.S. Appl. No. 13/242,084.
US Office Action dated Sep. 21, 2015 issued U.S. Appl. No. 14/607,997.
US Final Office Action dated Mar. 18, 2016 issued U.S. Appl. No. 14/607,997.
US Notice of Allowance dated Jun. 16, 2016 issued U.S. Appl. No. 14/607,997.
US Notice of Allowance dated Sep. 27, 2016 issued U.S. Appl. No. 14/607,997.
US Notice of Allowance dated Aug. 7, 2014 issued U.S. Appl. No. 14/133,239.
US Notice of Allowance dated Nov. 26, 2014 issued U.S. Appl. No. 14/133,239.
US Notice of Allowance dated Oct. 4, 2013 issued U.S. Appl. No. 13/472,282.
US Office Action dated May 21, 2014 issued in U.S. Appl. No. 13/607,386.
US Notice of Allowance dated Oct. 8, 2014 issued in U.S. Appl. No. 13/607,386.
US Notice of Allowance dated Nov. 19, 2014 issued U.S. Appl. No. 13/607,386.
US Office Action dated Jun. 13, 2014 issued in U.S. Appl. No. 13/953,616.
US Final Office Action dated Nov. 24, 2014 issued in U.S. Appl. No. 13/953,616.
US Office Action dated Dec. 11, 2014 issued in U.S. Appl. No. 14/074,596.
US Office Action dated Dec. 24, 2015 issued in U.S. Appl. No. 14/074,596.
US Notice of Allowance dated Feb. 12, 2016 issued in U.S. Appl. No. 14/074,596.
US Office Action dated May 15, 2015 issued in U.S. Appl. No. 14/074,617.
US Notice of Allowance dated Nov. 20, 2015 issued in U.S. Appl. No. 14/074,617.
US Office Action dated Aug. 14, 2015 issued in U.S. Appl. No. 14/061,587.
US Notice of Allowance dated Feb. 11, 2016 issued in U.S. Appl. No. 14/061,587.
US Notice of Allowance [Supplemental Notice of Allowability] dated Mar. 1, 2016 issued in U.S. Appl. No. 14/061,587.
US Office Action dated Mar. 2, 2015 issued in U.S. Appl. No. 14/137,860.
US Notice of Allowance dated Oct. 1, 2015 issued in U.S. Appl. No. 14/137,860.
US Notice of Allowance [Supplemental Notice of Allowability] dated Oct. 22, 2015 issued in U.S. Appl. No. 14/137,860.
US Office Action dated Jul. 10, 2014 issued in U.S. Appl. No. 14/144,107.
US Final Office Action dated Jan. 15, 2015 issued in U.S. Appl. No. 14/144,107.
US Notice of Allowance dated Mar. 19, 2015 issued in U.S. Appl. No. 14/144,107.
US Office Action dated Oct. 21, 2015 issued in U.S. Appl. No. 14/194,549.
US Final Office Action dated Nov. 1, 2016 issued in U.S. Appl. No. 14/194,549.
US Notice of Allowance dated Aug. 5, 2015 issued in U.S. Appl. No. 14/183,287.
US Office Action dated Aug. 1, 2016 issued in U.S. Appl. No. 14/932,869.
US Office Action dated Jul. 2, 2015 issued in U.S. Appl. No. 14/187,145.
US Final Office Action dated Dec. 16, 2015 issued in U.S. Appl. No. 14/187,145.
US Notice of Allowance dated Feb. 25, 2016 issued in U.S. Appl. No. 14/187,145.
US Office Action dated Jun. 14, 2016 issued in U.S. Appl. No. 15/019,904.
US Notice of Allowance dated Oct. 13, 2016 issued in U.S. Appl. No. 15/019,904.
US Office Action dated Apr. 13, 2015 issued in U.S. Appl. No. 14/335,785.
US Final Office Action dated Aug. 24, 2016 issued in U.S. Appl. No. 14/335,785.
US Office Action dated May 25, 2016 issued in U.S. Appl. No. 14/552,011.
US Notice of Allowance dated Sep. 26, 2016 issued in U.S. Appl. No. 14/552,011.
US Notice of Allowance dated Jul. 15, 2016 issued in U.S. Appl. No. 14/678,736.
Taiwan Office Action dated Apr. 27, 2016 issued in Application No. TW 100113041.
Chinese First Office Action dated Jun. 2, 2015 issued in Application No. CN 201180045808.6.
Chinese Second Office Action dated Feb. 2, 2016 issued in Application No. CN 201180045808.6.
Taiwan Office Action dated May 5, 2016 issued in TW 100134208.
PCT International Preliminary Report on Patentability and Written Opinion dated Apr. 3, 2014, issued in Application No. PCT/US2012/052769.
Chinese First Office Action dated Nov. 19, 2015 issued in Application No. CN 201280046487.6.
Chinese Second Office Action dated Aug. 22, 2016 issued in Application No. CN 201280046487.6.
Japanese Office Action dated Aug. 23, 2016 issued in Application No. JP 2014-531838.
Singapore Supplementary Examination Report dated Jun. 1, 2016 issued in SG 11201400633R.

(56) References Cited

OTHER PUBLICATIONS

Taiwan Notice of Allowance and Search Report dated Dec. 18, 2015 issued in Application No. TW 101134692.
PCT International Preliminary Report on Patentability and Written Opinion dated Mar. 13, 2014, issued in Application No. PCT/US2012/051740.
Chinese First Office Action dated Nov. 6, 2015 issued in Application No. CN 201280053888.4.
Chinese Second Office Action dated Aug. 16, 2016 issued in Application No. CN 201280053888.4.
Taiwan Office Action and Search Report dated Jan. 27, 2016 issued in Application No. TW 101134692.
Chinese First Office Action dated May 19, 2016 issued in CN 201310021460.8.
European Extended Search Report dated Apr. 14, 2014 issued in Application No. EP 13 15 2046.
Korean Notice of Provisional Rejection dated Dec. 6, 2013 issued in Application No. KR 10-2012-0043797.
Korean Final Office Action dated Aug. 18, 2014 issued in Application No. KR 10-2012-0043797.
Korean Decision from the Patent Tribunal of the KIPO (description) dated May 26, 2015 issued in Application No. KR 10-2012-0043797.
PCT International Preliminary Report on Patentability and Written Opinion dated Aug. 7, 2014, issued in Application No. PCT/US2013/022977.
Chinese First Office Action dated Feb. 22, 2016 issued in Application No. CN 201380006994.1.
Singapore Supplementary Examination Report dated Aug. 11, 2016 issued in SG 11201404315R.
Taiwan Office Action and Search Report dated Jul. 20, 2016 issued in Application No. TW 102102879.
Chinese First Office Action dated Apr. 11, 2016 issued in Application No. CN 201510086588.1.
Japanese Office Action dated Apr. 19, 2016 issued in Application No. JP 201521804.
Korean First Office Action dated Feb. 19, 2016, issued in Application No. KR 10-2015-0022610.
Korean Final Office Action dated Jun. 29, 2016, issued in Application No. KR 10-2015-0022610.
Hausmann et al., (2002) "Atomic Layer Deposition of Hafnium and Zirconium Oxides Using Metal Amide Precursors," *Chem. Mater.* 14(10):4350-4358.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lavareda et al., (2004) "Properties of a-Si:H TFTs using silicon carbonitride as dielectric," *Journal of Non-Crystalline Solids*, 338-340:797-801.
Li, Xingcun, et al., (2011) "Atomic Layer Deposition $Al_2O_3$ Thin Films in Magnetized Radio Frequency Plasma Source," *Physics Procedia* 18:100-106.
Puurunen, Riikka L. (2005) "Surface chemistry of atomic layer deposition: A case study for the trimethylaluminum/water process," *Journal of Applied Physics*, 97:121301-1--121301-52.
Van der Straten et al., (2004) "Atomic layer deposition of tantalum nitride for ultrathin liner applications in advanced copper metallization schemes," *Journal of Materials Research*, 19(2):447-453.
Taiwan Office Action and Search Report dated Nov. 9, 2016 issued in Application No. TW 101131556.

\* cited by examiner

|  | Reactive Pretreatment | | | Standard CFD oxide cycle | | | |
| --- | --- | --- | --- | --- | --- | --- | --- |
|  | PT_RF | Pump to Base | Post RF PT Purge | BTBAS Dose | Purge | O₂RF | Purge | Repeat |
| Time (s) | 1.8 | 10 | 5 | 2 | 2 | 2 | 1 | X cycles |
| RF (W) | 200 or 500 | -- |  | -- | -- | 2500 | -- | " " |
| P (T) | 3 | 0.2 | 3 | 2 | 2 | 2 | 2 | " " |
| Gas Flows (SLM) | O₂: 2 NH₃ or He: 7.5 | O₂: 2 AR: 5 | O₂: 4 AR: 5 | 2mL/min | O₂: 4 AR: 10 | O₂: 4 AR: 10 | O₂: 4 AR: 10 |  |

FIG. 18

PLASMA ACTIVATED CONFORMAL DIELECTRIC FILM DEPOSITION

CROSS REFERENCE TO RELATED APPLICATIONS

This application claims priority under 35 U.S.C. §120 as a continuation in part of US patent application Ser. No. 13/084,399, filed Apr. 11, 2011, which claims benefit of U.S. provisional patent application No. 61/324,710, filed Apr. 15, 2010, and U.S. provisional patent application No. 61/372,367, filed Aug. 10, 2010, and U.S. provisional patent application No. 61/379,081, filed Sep. 1, 2010, and U.S. provisional patent application No. 61/417,807, filed Nov. 29, 2010. Each of the above patent applications is incorporated herein by reference in its entirety and for all purposes. This application is also a continuation in part of US patent application Ser. No. 13/084,305, filed Apr. 11, 2011, and incorporated herein by reference in its entirety and for all purposes.

BACKGROUND

Various thin film layers for semiconductor devices may be deposited with atomic layer deposition (ALD) processes. However, existing ALD processes may not be suitable for depositing highly conformal dielectric films.

SUMMARY

Various aspects disclosed herein pertain to methods of depositing a film on a substrate surface. In certain embodiments, the methods include depositing a film by surface mediated reactions in which the film is grown over one or more cycles of reactant adsorption and reaction. In one aspect, the method is characterized by intermittent delivery of dopant species to the film between the cycles of adsorption and reaction.

In one aspect, a disclosed method deposits a nitrogen and/or carbon doped dielectric film on a substrate surface in a reaction chamber. The method may be characterized by the following sequence: (a) introducing a silicon oxide or silicon nitride precursor into the reaction chamber under conditions allowing the precursor to adsorb onto the substrate surface; (b) thereafter purging the precursor from the reaction chamber while the precursor remains adsorbed on the substrate surface; (c) exposing the substrate surface to plasma to drive a reaction of the dielectric precursor on the substrate surface to form a portion of the dielectric film; (d) introducing a carbon and/or nitrogen-containing dopant species into the reaction chamber under conditions allowing the dopant precursor to contribute nitrogen and/or carbon to the dielectric film; and (e) repeating (a)-(c). In various embodiments, the dopant species introduced in (d) is not introduced during (a)-(c). In some implementations, the substrate is held at a temperature of between about 100° C. and 350° C. during (a)-(e). In certain embodiments, the substrate surface is exposed to the carbon and/or nitrogen-containing dopant species prior to (a)-(c).

In certain embodiments, an oxidant flows into the reaction chamber prior to and during (a)-(c). In some cases, the silicon oxide or silicon nitride precursor and the oxidant co-exist in vapor phase in the reaction chamber. In such cases, the precursor and the oxidant may not appreciably react with one another in the reaction chamber until exposure to plasma in (c).

Reactants of various types may be employed. For example, in certain embodiments, the oxidant is nitrous oxide. In some embodiments, the silicon oxide precursor is BTBAS or BDEAS. In some embodiments, the silicon nitride precursor is dichlorosilane, BTBAS or BDEAS. In some cases, the dopant containing material is a hydrocarbon, alcohol, ketone, aldehyde, ether, ester, carboxylic acid, oxolane, or furan. Specific examples include methane, ethane, propane, acetylene, ethylene, propylene, t-amyl alcohol, ethanol, propanol, ethyleneglycol, and propyne. In some cases, the dopant containing material is ammonia or an amine, nitrile, amide, nitrogen-containing heterocyclic compound, or amino alcohol. Specific examples include ammonia, hydrazine, elemental nitrogen, acetonitrile, t-butylamine, ethanolamine, ethylamine, and triethylamine.

In the above method, an additional operation (f) of reacting the carbon and/or nitrogen-containing dopant species may be employed. This operation introduces a dopant to the film. In certain embodiments, operation (f) involves exposing the carbon and/or nitrogen-containing dopant species to a plasma.

In certain embodiments, the method additionally includes repeating (d) and (e) one or more times. In some cases, (a)-(c) are repeated multiple times prior repeating (d). And in some examples, (d) is performed at intervals between one or more repetitions of (a)-(c), where such intervals vary over the course of depositing the nitrogen and/or carbon doped dielectric film.

The film deposited during (a)-(c) may be between about 0.5 to 5 Angstroms in some cases. Further, in some examples, the total film thickness is between about 10-20000 Angstroms.

In some aspects, the disclosed embodiments concern an apparatus for depositing a nitrogen and/or carbon doped dielectric film on a substrate surface. Such apparatus may contain the following features: a reaction chamber comprising a device for holding the substrate during deposition of the doped dielectric film; one or more process gas inlets coupled to the reaction chamber; and a controller designed or configured to cause the apparatus to perform various operations. The operations may include the following: (a) introducing a silicon oxide or silicon nitride precursor into the reaction chamber under conditions allowing the precursor to adsorb onto the substrate surface; (b) thereafter purging the precursor from the reaction chamber while the precursor remains adsorbed on the substrate surface; (c) exposing the substrate surface to plasma to drive a reaction of the dielectric precursor on the substrate surface to form a portion of the dielectric film; (d) introducing a carbon and/or nitrogen-containing dopant species, not introduced during (a)-(c), into the reaction chamber under conditions allowing the dopant precursor to contribute nitrogen and/or carbon to the dielectric film; and (e) repeating (a)-(c). Certain aspects of the controller's operations may include details as described above in the context of the method operations.

In a further aspect, a method includes the following operations: (a) providing a substrate in a reaction chamber; (b) introducing a first reactant in vapor phase into the reaction chamber under conditions allowing the first reactant to adsorb onto the substrate surface; (c) introducing a second reactant in vapor phase into the reaction chamber while the first reactant is adsorbed on the substrate surface; (d) exposing the substrate surface to plasma to drive a reaction between the first and second reactants on the substrate surface to form a portion of the film; (e) repeating (b)-(d) at least once; (f) introducing a third reactant, not introduced during (b)-(e), into the reaction chamber under conditions allowing the third reactant to adsorb onto the substrate surface; (g) reacting the third reactant to produce a dopant for the film; and (h) repeating (b)-(d).

These and other features will be described in more detail below with reference to the associated drawings.

BRIEF DESCRIPTION OF THE DRAWINGS

FIG. 18 presents an example of a CFD sequence for deposition of a doped dielectric.

DETAILED DESCRIPTION

Figure 1:
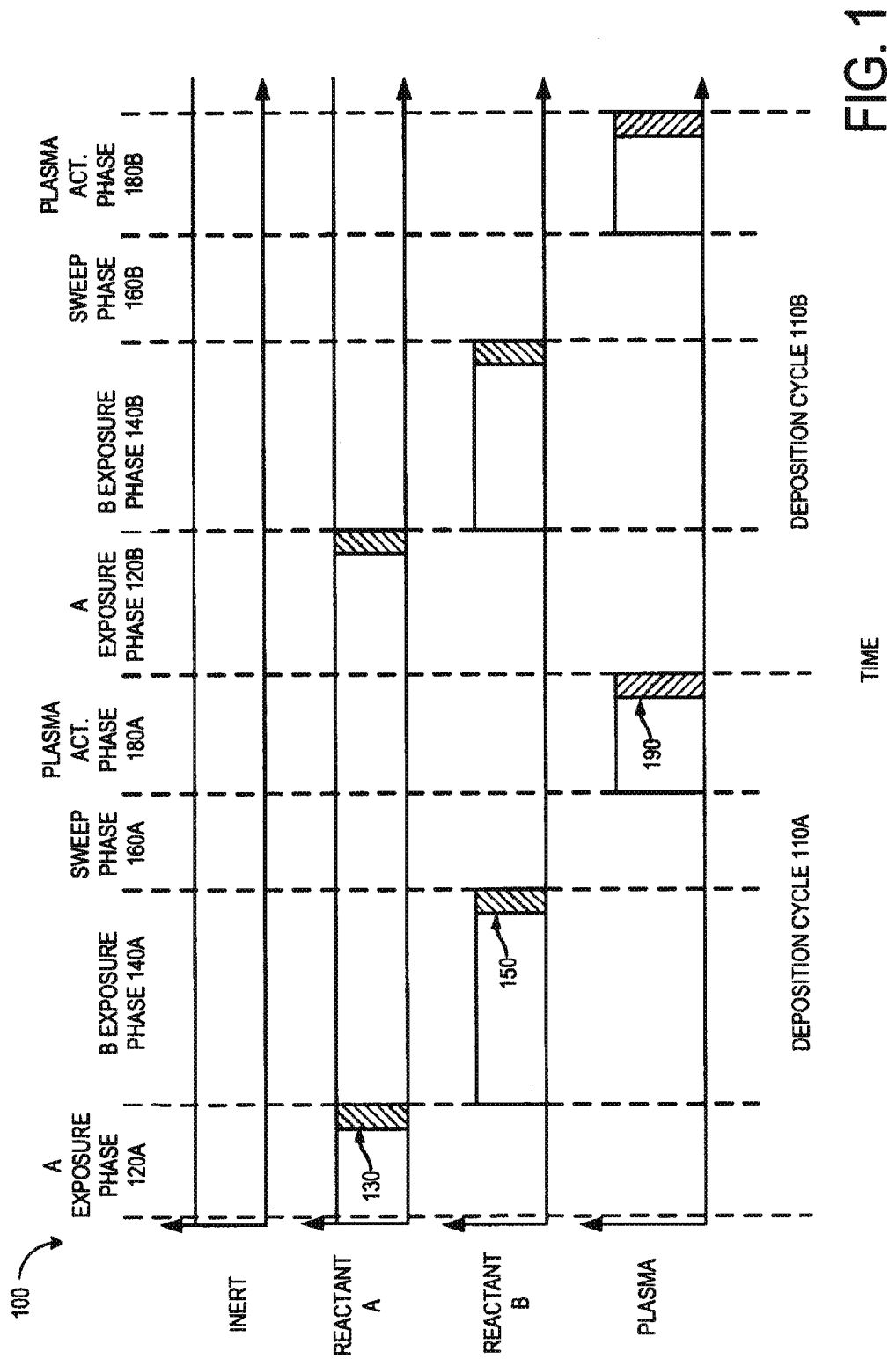
FIG. 1 schematically shows a timing diagram for an example conformal film deposition (CFD) process according to an embodiment of the present disclosure.

Manufacture of semiconductor devices typically involves depositing one or more thin films on a non-planar substrate in an integrated fabrication process. In some aspects of the integrated process it may be useful to deposit thin films that conform to substrate topography. For example, a silicon nitride film may be deposited on top of an elevated gate stack to act as a spacer layer for protecting lightly-doped source and drain regions from subsequent ion implantation processes.

In spacer layer deposition processes, chemical vapor deposition (CVD) processes may be used to form a silicon nitride film on the non-planar substrate, which is then anisotropically etched to form the spacer structure. However, as a distance between gate stacks decreases, mass transport limitations of CVD gas phase reactions may cause "bread-loafing" deposition effects. Such effects typically exhibit thicker deposition at top surfaces of gate stacks and thinner deposition at the bottom corners of gate stacks. Further, because some die may have regions of differing device density, mass transport effects across the wafer surface may result in within-die and within-wafer film thickness variation. These thickness variations may result in over-etching of some regions and under-etching of other regions. This may degrade device performance and/or die yield.

Some approaches to addressing these issues involve atomic layer deposition (ALD). In contrast with a CVD process, where thermally activated gas phase reactions are used to deposit films, ALD processes use surface-mediated deposition reactions to deposit films on a layer-by-layer basis. In one example ALD process, a substrate surface, including a population of surface active sites, is exposed to a gas phase distribution of a first film precursor (P1). Some molecules of P1 may form a condensed phase atop the substrate surface, including chemisorbed species and physisorbed molecules of P1. The reactor is then evacuated to remove gas phase and physisorbed P1 so that only chemisorbed species remain. A second film precursor (P2) is then introduced to the reactor so that some molecules of P2 adsorb to the substrate surface. The reactor may again be evacuated, this time to remove unbound P2. Subsequently, thermal energy provided to the substrate activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness.

Depending on the exposure time of the precursor dosing steps and the sticking coefficients of the precursors, each ALD cycle may deposit a film layer of, in one example, between one-half and three angstroms thick. Thus, ALD processes may be time consuming when depositing films more than a few nanometers thick. Further, some precursors may have long exposure times to deposit a conformal film, which may also reduce wafer throughput time.

Conformal films may also be deposited on planar substrates. For example, antireflective layers for lithographic patterning applications may be formed from planar stacks comprising alternating film types. Such antireflective layers may be approximately 100 to 1000 angstroms thick, making ALD processes less attractive than CVD processes. However, such anti-reflective layers may also have a lower tolerance for within-wafer thickness variation than many CVD processes may provide. For example, a 600-angstrom thick antireflective layer may tolerate a thickness range of less than 3 angstroms.

Accordingly, various embodiments are provided herein providing processes and equipment for plasma-activated conformal film deposition (CFD) on non-planar and planar substrates. These embodiments incorporate various features employed in some but not all CFD processes. Among these features are (1) eliminating or reducing the time required to "sweep" one or both reactants from the reaction chamber, (2) providing a continuous flow of at least one reactant while a different reactant is intermittently flowed into the reaction chamber, (3) igniting plasma while one of the reactants is present in the gas phase, rather than when all reactants are cleared from the reaction chamber, (4) treating deposited CFD films with a plasma to modify the film properties, (5) depositing a portion of a film by PECVD after depositing a first portion of the film by CFD, typically in the same reaction chamber, (6) etching a partially deposited film between CFD stages, and (7) doping the CFD film by interspersing dopant delivery cycles with film only deposition cycles. Of course, this list is not exhaustive. Various other CFD features will be apparent when considering the remainder of the specification.

The concept of a CFD "cycle" is relevant to the discussion of various embodiments herein. Generally a cycle is the minimum set of operations required to perform a surface deposition reaction one time. The result of one cycle is production of at least a partial film layer on a substrate surface. Typically, a CFD cycle will include only those steps necessary to deliver and adsorb each reactant to the substrate surface, and then react those adsorbed reactants to form the partial layer of film. Of course, the cycle may include certain ancillary steps such as sweeping one of the reactants or byproducts and/or treating the partial film as deposited. Generally, a cycle contains only one instance of a unique sequence of operations. As an example, a cycle may include the following operations: (i) delivery/adsorption of reactant A, (ii) delivery/adsorption of reactant B, (iii) sweep B out of the reaction chamber, and (iv) apply plasma to drive a surface reaction of A and B to form the partial film layer on the surface.

The seven above-mentioned features will now be discussed further. In the following descriptions, consider a CFD reaction in which one or more reactants adsorb to the substrate surface and then react to form a film on the surface by interaction with plasma.

Feature 1 (Continuous flow of a reactant)—Reactant A continues to flow to a reaction chamber during one or more portions of a CFD cycle when the reactant would not normally flow in conventional ALD. In conventional ALD, reactant A flows only for the purpose of having the reactant adsorb onto the substrate surface. At other phases of an ALD cycle, reactant A does not flow. In accordance with certain CFD embodiments described herein, however, reactant A flows not only during phases associated with its adsorption but also during phases of a CFD cycle that perform operations other than adsorption of A. For example, in many embodiments, reactant A flows into the reactor while the apparatus is dosing a second reactant (reactant B herein). Thus, during at least a portion of a CFD cycle, reactants A and B coexist in the gas phase. Further, reactant A may flow while plasma is applied to drive a reaction at the substrate surface. Note that the continuously flowing reactant may be delivered to the reaction chamber in conjunction with a carrier gas—e.g., argon.

One advantage of the continuous flow embodiment is that the established flow avoids the delays and flow variations caused by transient initialization and stabilization of flow associated with turning the flow on and off.

As a specific example, an oxide film may be deposited by a conformal film deposition process using a principal reactant (sometimes referred to as a "solid component" precursor or, in this example, simply "reactant B"). Bis(tert-butylamino)silane (BTBAS) is one such principal reactant. In this example, the oxide deposition process involves delivery of an oxidant such as oxygen or nitrous oxide, which flows initially and continuously during delivery of the principal reactant in distinct exposure phases. The oxidant also continues to flow during distinct plasma exposure phases. See for example the sequence depicted in FIG. 1. For comparison, in a conventional ALD process, the flow of oxidant would stop when the solid component precursor is delivered to the reactor. For example, the flow of reactant A would stop when reactant B is delivered.

In some specific examples, the reactant that flows continuously is an "auxiliary" reactant. As used herein, an "auxiliary" reactant is any reactant that is not a principal reactant. As suggested above, a principal reactant contains an element that is solid at room temperature, which element is contributed to the film formed by CFD. Examples of such elements are metals (e.g., aluminum and titanium), semiconductors (e.g., silicon and germanium), and non-metals or metalloids (e.g., boron). Examples of auxiliary reactants include oxygen, ozone, hydrogen, carbon monoxide, nitrous oxide, ammonia, alkyl amines, and the like.

The continuously flowing reactant may be provided at a constant flow rate or at varied but controlled flow rate. In the latter case, as an example, the flow rate of an auxiliary reactant may drop during an exposure phase when the primary reactant is delivered. For example, in oxide deposition, the oxidant (e.g., oxygen or nitrous oxide) may flow continuously during the entire deposition sequence, but its flow rate may drop when the primary reactant (e.g., BTBAS) is delivered. This increases the partial pressure of BTBAS during its dosing, thereby reducing the exposure time needed to saturate the substrate surface. Shortly before igniting the plasma, the flow of oxidant may be increased to reduce the likelihood that BTBAS is present during the plasma exposure phase. In some embodiments, the continuously flowing reactant flows at a varied flow rate over the course of two or more deposition cycles. For example, the reactant may flow at a first flow rate during a first CFD cycle and at a second flow rate during a second CFD cycle.

When multiple reactants are employed and the flow of one of them is continuous, at least two of them will co-exist in the gas phase during a portion of the CFD cycle. Similarly, when no purge step is performed after delivery of the first reactant, two reactants will co-exist. Therefore, it may be important to employ reactants that do not appreciably react with one another in the gas phase absent application of activation energy. Typically, the reactants should not react until present on the substrate surface and exposed to plasma or another appropriate non-thermal activation condition. Choosing such reactants involves considerations of at least (1) the thermodynamic favorability (Gibb's free energy <0) of the desired reaction, and (2) the activation energy for the reaction, which should be sufficiently great so that there is negligible reaction at the desired deposition temperature.

Feature 2 (Reduce or eliminate a sweep step)—In certain embodiments, the process dispenses with or reduces the time associated with a sweep step that would normally be performed in conventional ALD. In conventional ALD, a separate sweep step is performed after each reactant is delivered and adsorbed onto the substrate surface. Little or no adsorption or reaction occurs in a conventional ALD sweep step. In a CFD cycle, the sweep step is reduced or eliminated after delivery of at least one of the reactants. An example of a process sequence in which a sweep step is removed is presented in FIG. 1. No sweep step is performed to sweep reactant A from the reaction chamber. In some cases, no sweep step is performed after delivery of the first reactant in a CFD cycle but a sweep step is optionally performed after delivery of the second or last delivered reactant.

The concept of a CFD "sweep" step or phase appears in the discussion various embodiments herein. Generally, a sweep phase removes or purges one of the vapor phase reactant from a reaction chamber and typically occurs only after delivery of such reactant is completed. In other words, that reactant is no longer delivered to the reaction chamber during sweep phase. However, the reactant remains adsorbed on the substrate surface during the sweep phase. Typically, the sweep serves to remove any residual vapor phase reactant in the chamber after the reactant is adsorbed on the substrate surface to the desired level. A sweep phase may also remove weakly adsorbed species (e.g., certain precursor ligands or reaction by-products) from the substrate surface. In ALD, the sweep phase has been viewed as necessary to prevent gas phase interaction of two reactants or interaction of one reactant with a thermal, plasma or other driving force for the surface reaction. In general, and unless otherwise specified herein, a sweep phase may be accomplished by (i) evacuating a reaction chamber, and/or (ii) flowing gas not containing the species to be swept out through the reaction chamber. In the case of (ii), such gas may be, for example, an inert gas or an auxiliary reactant such as a continuously flowing auxiliary reactant.

Elimination of the sweep phase may be accomplished with or without continuous flow of the other reactant. In the embodiment depicted in FIG. 1, reactant A is not swept away but rather continues to flow after its adsorption onto the substrate surface is completed (illustrated by reference number 130 in the figure).

In various embodiments where two or more reactants are employed, the reactant which has its sweep step eliminated or reduced is an auxiliary reactant. As an example, auxiliary reactant is an oxidant or a nitrogen source and the primary reactant is a silicon, boron, or germanium containing precursor. Of course, a sweep of the principal reactant may also be reduced or eliminated. In some examples, no sweep step is performed after delivery of an auxiliary reactant but a sweep step is optionally performed after delivery of a principal reactant.

As mentioned, the sweep phase need not be fully eliminated but simply reduced in duration in comparison to sweep phases in conventional ALD processes. For example, the sweep phase of a reactant such as an auxiliary reactant during a CFD cycle may be performed for about 0.2 seconds or less, e.g., for about 0.001 to 0.1 seconds.

Feature 3 (Igniting plasma while one of the reactants is present in the gas phase)—With this feature, a plasma is ignited before all reactants have been cleared from the reaction chamber. This is contrary to conventional ALD, where the plasma activation or other reaction driving operation is provided only after the vapor phase reactants are no longer present in the reaction chamber. Note that this feature would necessarily occur when reactant A flows continuously during the plasma portion of a CFD cycle as depicted in FIG. 1. However, the disclosed embodiments are not limited in this manner. One or more reactants may flow during the plasma phase of a CFD cycle but need not flow continuously during a CFD cycle. Further, the reactant present in vapor phase during plasma activation may be a principal reactant or an auxiliary reactant (when two more reactants are employed in a CFD cycle).

For example, a sequence might be (i) introduce reactant A, (ii) purge A, (iii) introduce reactant B and while B is flowing strike a plasma, and (iv) purge. In such embodiments, the process employs a plasma activated reactant species from the gas phase. This is a general example where CFD is not constrained to a sequence of sequential steps.

If the activation plasma is provided during the time when the solid component precursor (primary reactant) is supplied to the reactor, the step coverage may become less conformal, but the deposition rate will typically increase. However if plasma activation occurs only during delivery of one an auxiliary reactant this is not necessarily the case. The plasma can activate the vapor phase auxiliary component to render it more reactive and thereby increase its reactivity in the conformal film deposition reaction. In certain embodiments, this feature is employed when depositing a silicon containing film such as an oxide, nitride, or carbide.

Feature 4 (Plasma treatment of deposited CFD films)—In these embodiments, the plasma may serve two or more roles in the conformal film deposition process. One of its roles is to activate or drive the film formation reaction during each CFD cycle. Its other role is to treat the film after the CFD film has been partially or fully deposited following one or more CFD cycles. The plasma treatment is intended to modify one or more film properties. Typically, though not necessarily, the plasma treatment phase is conducted under conditions that are different from those employed to activate the film formation reaction (i.e., to drive the film formation reaction). As an example, the plasma treatment may be performed in the presence of a reducing or oxidizing environment (e.g., in the presence of hydrogen or oxygen), while this need not be the case during the activation portion of a CFD cycle.

The plasma treatment operation may be performed during every cycle of the CFD process, during every other cycle, or on some less frequent basis. The treatment may be performed on regular intervals, tied to a fixed number of CFD cycles, or it may be performed variably (e.g., at varying intervals of CFD cycles) or even randomly. In a typical example, film deposition is performed for a few CFD cycles, to reach appropriate film thickness, and then the plasma treatment is employed. Thereafter, film deposition is again performed for a number of CFD cycles without plasma treatment before the treatment is again performed. This super-sequence of x number of CFD cycles, followed by plasma treatment (film modification) may be repeated until the film is completely formed by CFD.

In certain embodiments, the plasma treatment may be performed before initiation of CFD cycling to modify one or more properties of the surface on which the CFD film is deposited. In various embodiments, the surface is made from silicon (doped or undoped) or a silicon containing material. The modified surface may be better able to produce a high quality interface with the subsequently deposited CFD film. The interface may provide, e.g., good adhesion, reliable electrical properties through, e.g., defect reduction, etc.

The pretreatment of the substrate prior to CFD is not limited to any particular plasma treatment. In certain embodiments, the pre-treatment involves exposure to hydrogen-plasma, nitrogen-plasma, nitrogen/hydrogen-plasma, ammonia-plasma, argon-plasma, helium-plasma, helium anneal, hydrogen-anneal, ammonia-anneal, and UV-cure in the presence of helium, hydrogen, argon, nitrogen, hydrogen/nitrogen-forming gas, and/or ammonia. Plasma processing may be enabled with various plasma generators including, though not limited to, microwave, ICP-remote, direct and others known to those in the art.

Overall, the treatment may occur before, during and after CFD cycling. When occurring during CFD cycling, the frequency of treatment may be chosen for the appropriate deposition conditions. Typically, the treatment will occur not more often than once per cycle.

As an example, consider a process for forming silicon nitride from precursors having some carbon present. Examples of such precursors include BTBAS. As a consequence of the carbon present in the precursor, the as deposited nitride film includes some carbon impurity, which may degrade the electrical properties of the nitride. To counteract this problem, after a few CFD cycles with the carbon-containing precursor, the partially deposited film is exposed to hydrogen in the presence of plasma to reduce and ultimately remove the carbon impurity.

The plasma conditions employed to modify the film surface may be chosen to effect a desired change in film properties and/or composition. Among the plasma conditions that can be selected and/or tailored for the desired modification are oxidizing conditions, reducing conditions, etching conditions, power used to generate the plasma, frequency used to generate the plasma, use of two or more frequencies to generate the plasma, plasma density, the distance between the plasma and the substrate, etc. Examples of CFD film properties that can be modified by plasma treatment include, internal film stress, etch resistance, density, hardness, optical properties (refractive index, reflectivity, optical density, etc.), dielectric constant, carbon content, electrical properties (Vfb spread, etc.), and the like.

In some embodiments, a treatment other than a plasma treatment is employed to modify the properties of the as deposited film. Such treatments include electromagnetic radiation treatments, thermal treatments (e.g., anneals or high temperature pulses), and the like. Any of these treatments may be performed alone or in combination with another treatment, including a plasma treatment. Any such treatment can be employed as a substitute for any of the above-described plasma treatments. In a specific embodiment, the treatment involves exposing the film to ultraviolet radiation. As described below, in a specific embodiment, the method involves the application of UV-radiation to an oxide CFD film in situ (i.e., during formation of the film) or post deposition of the oxide. Such treatment serves to reduce or eliminate defect structure and provide improved electrical performance.

In certain specific embodiments, a UV treatment can be coupled with a plasma treatment. These two operations can be performed concurrently or sequentially. In the sequential option, the UV operation optionally takes place first. In the concurrent option, the two treatments may be provided from separate sources (e.g., an RF power source for the plasma and a lamp for the UV) or from a single source such as a helium plasma that produces UV radiation as a byproduct.

Feature 5 (Depositing by CFD and then transitioning to PECVD)—In such embodiments, the completed film is generated in part by CFD and in part by a CVD process such as PECVD. Typically, the CFD portion of the deposition process if performed first and the PECVD portion is performed second, although this need not be the case. Mixed CFD/CVD processes can improve the step coverage over that seen with CVD alone and additionally improve the deposition rate over that seen with CFD alone. In some cases, plasma or other activation is applied while one CFD reactant is flowing in order to produce parasitic CVD operations and thereby achieve higher deposition rates, a different class of films, etc.

In certain embodiments, two or more CFD phases may be employed and/or two or more CVD phases may be employed. For example, an initial portion of the film may be deposited by CFD, followed by an intermediate portion of the film being deposited by CVD, and a final portion of the film deposited by CFD. In such embodiments, it may be desirable to modify the CVD portion of the film, as by plasma treatment or etching, prior to depositing the later portion of the film by CFD.

A transition phase may be employed between the CFD and CVD phases. The conditions employed during such transition phase different from those employed in either the CFD or the CVD phases. Typically, though not necessarily, the conditions permit simultaneous CFD surface reactions and CVD type gas phase reaction. The transition phase typically involves exposure to a plasma, which may be pulsed for example. Further, the transition phase may involve delivery of one or more reactants a low flow rate, i.e., a rate that is significantly lower than that employed in the corresponding CFD phase of the process.

Feature 6 (Deposit by CFD, etch, and then further deposit by CFD)—In such embodiments, CFD deposition is performed for one or more cycles (typically a number of cycles) and then the resulting film is etched to remove, for example, some excess film at or near a recess entrance (a cusp), followed by further cycles of CFD deposition. Other examples of structural features in the deposited film that may be etched in a similar manner. The etchant chosen for this process will depend on the material to be etched. In some cases, the etch operation may be performed with a fluorine containing etchant (e.g., NF3) or hydrogen.

In certain embodiments, a remote plasma is employed to produce the etchant. Generally, a remote plasma etches in a more isotropic fashion than a direct plasma. A remote plasma generally provides a relatively high fraction of radicals to the substrate. The reactivity of these radicals may vary with the vertical position within the recess. At the top of the feature, the radicals are more concentrated and consequently will etch at a higher rate, while further down the recess and at the bottom, some radicals will have been lost and therefore they will etch at a lower rate. This is of course a desirable reactivity profile for addressing the problem of too much deposition occurring at the recess opening. An additional benefit of using a remote plasma in etching is that the plasma is relatively gentle and hence unlikely to damage the substrate layer. This can be particularly beneficial when the underlying substrate layer is sensitive oxidation or other damage.

Feature 7 (Tailoring the film composition with additional reactant)—Many of the examples presented herein concern CFD processes employing one or two reactants. Further, many of the examples employ the same reactants in every CFD cycle. However, this need not be the case. First, many CFD processes may employ three or more reactants. Examples include (i) CFD of tungsten using as reactants diborane, tungsten hexafluoride, and hydrogen, and (ii) CFD of silicon oxide using as reactants diborane, BTBAS, and oxygen. The diborane can be removed from the growing film or it can be incorporated into the film if appropriate.

Further, some examples may employ additional reactants in only some CFD cycles. In such examples, a basic CFD process cycle employs only the reactants to create the base film composition (e.g., silicon oxide or silicon carbide). This basic process is performed in all or nearly all CFD cycles. However, some of the CFD cycles are executed as variant cycles and they deviate from the conditions of the normal deposition cycles. For example, they may employ one or more additional reactants. These variant cycles may also employ the same reactants employed in the basic CFD process, although this need not be the case.

Such CFD processes are particularly beneficial in preparing doped oxides or other doped materials as CFD films. In some implementations, dopant precursors are included as the "additional" reactant in only a small fraction of the CFD cycles. The frequency of adding the dopant is dictated by the desired concentration of dopant. For example, the dopant precursor may be included in every 10th cycle of the base material deposition.

Unlike many other deposition processes, particularly those requiring thermal activation, the CFD process may be conducted at a relatively low temperature. Generally, the CFD temperature will be between about 20 and 400 C. Such temperature may be chosen to permit deposition in the context of a temperature sensitive process such as deposition on a photoresist core. In a specific embodiment, a temperature of between about 20 and 100 C is used for double patterning applications (using, e.g., photoresist cores). In another embodiment, a temperature of between about 200 and 350 C is employed for memory fabrication processing.

As suggested above, CFD is well suited for depositing films in advanced technology nodes. Thus, for example, CFD processing may be integrated in processes at the 32 nm node, the 22 nm node, the 16 nm node, the 11 nm node, and beyond any of these. These nodes are described in the International Technology Roadmap for Semiconductors (ITRS), the industry consensus on microelectronic technology requirements for many years. Generally they reference one-half pitch of a memory cell. In a specific example, the CFD processing is applied to "2X" devices (having device features in the realm of 20-29 nm) and beyond.

While most examples of CFD films presented herein concern silicon based microelectronic devices, the films may also find application in other areas. Microelectronics or optoelectronics using non-silicon semiconductors such as GaAs and other III-V semiconductors, as well as II-VI materials such as HgCdTe may profit from using the CFD processes disclosed herein. Applications for conformal dielectric films in the solar energy field, such as photovoltaic devices, in the electrochromics field, and other fields are possible.

FIG. 1 schematically shows a timing diagram 100 for an example embodiment of a plasma-activated CFD process. Two full CFD cycles are depicted. As shown, each includes an exposure to reactant A phase 120A or 120B, directly followed by an exposure to reactant B phase 140A or 140B, a sweep of reactant B phase 160A or 160B, and finally a plasma activation phase 180. Plasma energy provided during plasma activation phases 180A and 180B activates a reaction between surface adsorbed reactant species A and B. In the depicted embodiments, no sweep phase is performed after one reactant (reactant A) is delivered. In fact, this reactant flows continuously during the film deposition process. Thus, plasma is ignited while reactant A is in the gas phase. Features 1-3 above are embodied in the example of FIG. 1.

In the depicted embodiment, reactant gases A and B may co-exist in the gas phase without reacting. Accordingly, one or more of the process steps described in the ALD process may be shortened or eliminated in this example CFD process. For example, sweep steps after A Exposure Phases 120A and 120B may be eliminated.

The CFD process may be employed to deposit any of a number of different types of film. While most of the examples presented herein, concern dielectric materials, the disclosed CFD processes may be employed to form films of conductive and semiconductor materials as well. Nitrides and oxides are featured dielectric materials, but carbides, oxynitrides, carbon-doped oxides, borides, etc. may also be formed. Oxides include a wide range of materials including undoped silicate glass (USG), doped silicate glass. Examples of doped glasses included boron doped silicate glass (BSG), phosphorus doped silicate glass (PSG), and boron phosphorus doped silicate glass (BPSG).

In some embodiments, a silicon nitride film may be formed by reaction of a silicon-containing reactant and one or more of a nitrogen-containing reactant and/or a nitrogen-containing reactant blend. Example silicon-containing reactants include, but are not limited to, bis(tertiarybutylamino) silane ($SiH_2(NHC(CH_3)_3)_2$ or BTBAS), dichlorosilane ($SiH_2Cl_2$), and chlorosilane ($SiH_3Cl$). Example nitrogen-containing reactants include, but are not limited to, ammonia, nitrogen, and tert-butyl amine (($CH_3)_3CNH_2$ or t-butyl amine). An example nitrogen-containing reactant blend, includes, but is not limited to, a blend of nitrogen and hydrogen.

Selection of one or more reactants may be driven by various film and/or hardware considerations. For example, in some embodiments, a silicon nitride film may be formed from reaction of dichlorosilane and plasma-activated nitrogen. Chemisorption of dichlorosilane to a silicon nitride surface may create a silicon-hydrogen terminated surface, liberating hydrogen chloride (HCl). An example of this chemisorption reaction is schematically depicted in Reaction 1.

Reaction 1:

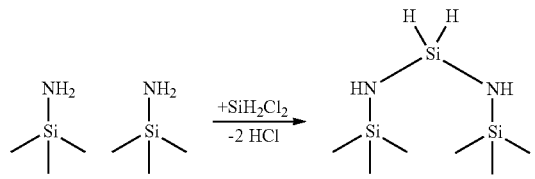

The cyclic intermediate shown in Reaction 1 may then be transformed into a silicon amine terminated surface via reaction with plasma-activated nitrogen.

However, some molecules of dichlorosilane may chemisorb by alternative mechanisms. For example, surface morphology may hinder the formation of the cyclic intermediate depicted in Reaction 1. An example of another chemisorption mechanism is shown schematically in Reaction 2.

Reaction 2:

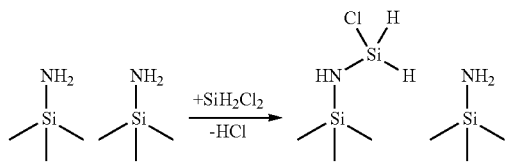

During subsequent plasma activation of nitrogen, the remaining chlorine atom of the intermediate species shown in Reaction 2 may be liberated and may become activated by the plasma. This may cause etching of the silicon nitride surface, potentially causing the silicon nitride film to become rough or hazy. Further, the residual chlorine atom may readsorb, physically and/or chemically, potentially contaminating the deposited film. This contamination may alter physical and/or electrical properties of the silicon nitride film. Further still, the activated chlorine atom may cause etch damage to portions of the process station hardware, potentially reducing the service life of portions of the process station.

Thus, in some embodiments, chlorosilane may be substituted for dichlorosilane. This may reduce film contamination, film damage, and/or process station damage. An example of the chemisorption of chlorosilane is schematically shown in Reaction 3.

Reaction 3:

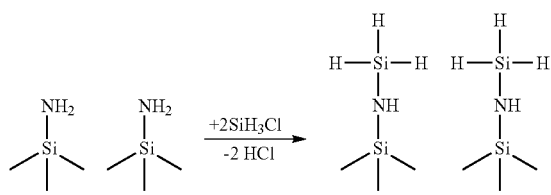

While the example depicted in Reaction 3 uses chlorosilane as the silicon-containing reactant, it will be appreciated that any suitable mono-substituted halosilane may be used.

As explained above, the depicted intermediate structures may react with a nitrogen source to form a silicon amine terminated surface of silicon nitride. For example, ammonia may be activated by a plasma, forming various ammonia radical species. The radical species react with the intermediate, forming the silicon amine terminated surface.

However, ammonia may physisorb strongly to surfaces of the reactant delivery lines, process station, and exhaust plumbing, which may lead to extended purge and evacuation times. Further, ammonia may have a high reactivity with some gas phase silicon-containing reactants. For example gas-phase mixtures of dichlorosilane ($SiH_2Cl_2$) and ammonia may create unstable species such as diaminosilane ($SiH_2(NH_2)_2$). Such species may decompose in the gas phase, nucleating small particles. Small particles may also be formed if ammonia reacts with hydrogen chloride generated during chemisorption of a halosilane. Such particles may accumulate in the process station where they may contaminate substrate surfaces, potentially leading to integrated device defects, and where they may contaminate process station hardware, potentially leading to tool down time and cleaning. The small particles may also accumulate in exhaust plumbing, may clog pumps and blowers, and may create a need for special environmental exhaust scrubbers and/or cold traps.

Thus, in some embodiments, a substituted amine may be used as a nitrogen-containing reactant. For example, various radicals formed from plasma activation of an alkyl substituted amine, such as t-butyl amine, may be supplied to the process station. Substituted amines such as t-butyl amine may have a lower sticking coefficient on process hardware than ammonia, which may result in comparatively lower phyisorbption rates and comparatively lower process purge time.

Further, such nitrogen-containing reactants may form halogenated salts that are comparatively more volatile than ammonium chloride. For example, t-butylammonium chloride may be more volatile than ammonium chloride. This may reduce tool down time, device defect creation, and environmental abatement expense.

Further still, such nitrogen-containing reactants may form other amine precursors via various byproduct reactions. For example, the reaction of t-butyl amine with dichlorosilane may form BTBAS. Thus, the side products may provide alternate routes to form silicon nitride, potentially increasing film yield. In another example, substituted amines may provide low temperature thermally activated routes to silicon nitride films. For example, t-butyl amine decomposes thermally at temperatures above 300° C. to form isobutylene and ammonia.

While the illustrative example provided above describes silicon nitride film formation using t-butyl amine, it will be appreciated that any suitable substituted amine may be employed within the scope of the present disclosure. Suitable substituted amines may be selected, in some embodiments, based on thermodynamic characteristics and/or reactivity characteristics of the reactant. For example, the relative volatility of halogenated salts formed from the reactant may be considered, as may the existence and selectivity of various thermal decomposition paths at relevant temperatures.

Further, while the examples provided above describe the deposition of silicon nitride films, it will be appreciated that the principles discussed above apply generally to the deposition of other films. For example, some embodiments may use suitable halosilanes in combination with a suitable oxygen-containing reactant species, such as an oxygen plasma, to deposit silicon oxides.

A non-limiting list of reactants, product films, and film and process property ranges are provided in Table 1.

TABLE 1

| Film | Reactant A | Reactant B | Reactant C | Temp. (C.) | Press. (torr) | Ref. index |
|---|---|---|---|---|---|---|
| SiO$_2$ | BTBAS | O$_2$ | — | 50-400 | 1-4 | 1.45-1.47 |
| SiN | SiH$_3$Cl | O$_2$ | — | 50-400 | 1-4 | |
| SiO$_2$ | SiH(N(CH$_3$)$_2$)$_3$ | O$_2$ | — | 50-400 | 1-4 | 1.45-1.47 |
| SiN | BTBAS | NH$_3$ | — | 50-400 | 1-4 | 1.80-2.05 |
| SiN | BTBAS | — | N$_2$/H$_2$ | 50-400 | 1-4 | 1.80-2.05 |
| SiN | BTBAS | NH$_3$ | N$_2$/H$_2$ | 50-400 | 1-4 | 1.80-2.05 |
| SiN | SiH$_3$Cl | NH$_3$ | Optionally N$_2$/H$_2$ | 50-400 | 1-4 | |
| SiN | SiH$_3$Cl | t-butyl amine | Optionally N$_2$/H$_2$ | | | |
| SiN | SiH$_2$Cl$_2$ | NH$_3$ | Optionally N$_2$/H$_2$ | 50-400 | 1-4 | 1.80-2.05 |
| SiN | SiH$_2$Cl$_2$ | t-butyl amine | Optionally N$_2$/H$_2$ | | | |
| SiN | SiH(CH$_3$)—(N(CH$_3$)$_2$)$_2$ | NH$_3$ | Optionally N$_2$/H$_2$ | 50-400 | 1-4 | 1.80-2.05 |
| SiN | SiH(CH$_3$)(Cl$_2$) | NH$_3$ | Optionally N$_2$/H$_2$ | 50-400 | 1-4 | 1.80-2.05 |
| SiN | SiHCl—(N(CH$_3$)$_2$)$_2$ | NH$_3$ | Optionally N$_2$/H$_2$ | 50-400 | 1-4 | 1.80-2.05 |
| SiN | (Si(CH$_3$)$_2$NH)$_3$ | NH$_3$ | Optionally N$_2$/H$_2$ | 50-400 | 1-4 | 1.80-2.05 |

FIG. 1 also shows an embodiment of a temporal progression of example CFD process phases for various CFD process parameters. FIG. 1 depicts two example deposition cycles 110A and 110B, though it will be appreciated that any suitable number of deposition cycles may be included in a CFD process to deposit a desired film thickness. Example CFD process parameters include, but are not limited to, flow rates for inert and reactant species, plasma power and frequency, substrate temperature, and process station pressure. Non-limiting parameter ranges for an example silicon dioxide deposition cycle using BTBAS and oxygen are provided in Table 2.

TABLE 2

| Phase | Reactant A exposure phase | Reactant B exposure phase | Sweep phase | Plasma activation phase |
|---|---|---|---|---|
| Time (sec) | continuing | 0.25-10 | 0.25-10 | 0.25-10 |
| BTBAS (sccm) | n/a | 0.5-5.0 | 0 | 0 |
| $O_2$ (slm) | 1-20 | 1-20 | 1-20 | 1-20 |
| Ar (slm) | 1-20 | 1-20 | 1-20 | 1-20 |
| Pressure (torr) | 1-4 | 1-4 | 1-4 | 1-4 |
| Temp (C.) | 50-400 | 50-400 | 50-400 | 50-400 |
| HF Power (W) | 0 | 0 | 0 | 50-2500 |
| LF Power (W) | 0 | 0 | 0 | 0-2500 |

A CFD cycle typically contains an exposure phase for each reactant. During this "exposure phase," a reactant is delivered to a process chamber to cause adsorption of the reactant on the substrate surface. Typically, at the beginning of an exposure phase, the substrate surface does not have any appreciable amount of the reactant adsorbed. In FIG. 1, at reactant A exposure phases 120A and B, reactant A is supplied at a controlled flow rate to a process station to saturate exposed surfaces of a substrate. Reactant A may be any suitable deposition reactant; e.g., a principal reactant or an auxiliary reactant. In one example where CFD produces a silicon dioxide film, reactant A may be oxygen. In the embodiment shown in FIG. 1, reactant A flows continuously throughout deposition cycles 110A and 110B. Unlike a typical ALD process, where film precursor exposures are separated to prevent gas phase reaction, reactants A and B are allowed to mingle in the gas phase of some embodiments of a CFD process. As indicated above, in some embodiments reactants A and B are chosen so that they can co-existence in the gas phase without appreciably reacting with one another under conditions encountered in the reactor prior to application of plasma energy or the activation of the surface reaction. In some cases, the reactants are chosen such that (1) a reaction between them is thermodynamically favorable (i.e., Gibb's free energy <0) and (2) the reaction has a sufficiently high activation energy that there is negligible reaction at the desired deposition temperature. Various reactant combinations meeting these criteria are identified at other locations in this disclosure. Many such combinations include a primary reactant, which contributes an element that is solid at room temperature, and an auxiliary reactant, which does not. Examples of auxiliary reactants used in some combinations include oxygen, nitrogen, alkyl amines, and hydrogen.

Continuously supplying reactant A to the process station may reduce or eliminate a reactant A flow rate turn-on and stabilization time compared to an ALD process where reactant A is first turned on, then stabilized and exposed to the substrate, then turned off, and finally removed from a reactor. While the embodiment shown in FIG. 1 depicts reactant A exposure phases 120A and B as having a constant flow rate, it will be appreciated that any suitable flow of reactant A, including a variable flow, may be employed within the scope of the present disclosure. Further, while FIG. 1 shows reactant A having a constant flow rate during the entire CFD cycle (deposition cycle 110A), this need not be the case. For example, the flow rate of reactant A may decrease during B exposure phases 140A and 140B. This may increase the partial pressure of B and thereby increase the driving force of reactant B adsorbing on the substrate surface.

In some embodiments, reactant A exposure phase 120A may have a duration that exceeds a substrate surface saturation time for reactant A. For example, the embodiment of FIG. 1 includes a reactant A post-saturation exposure time 130 in reactant A exposure phase 120A. Optionally, reactant A exposure phase 120A includes a controlled flow rate of an inert gas. Example inert gases include, but are not limited to, nitrogen, argon, and helium. The inert gas may be provided to assist with pressure and/or temperature control of the process station, evaporation of a liquid precursor, more rapid delivery of the precursor and/or as a sweep gas for removing process gases from the process station and/or process station plumbing.

At Reactant B exposure phase 140A of the embodiment shown in FIG. 1, reactant B is supplied at a controlled flow rate to the process station to saturate the exposed substrate surface. In one example silicon dioxide film, reactant B may be BTBAS. While the embodiment of FIG. 1 depicts reactant B exposure phase 140A as having a constant flow rate, it will be appreciated that any suitable flow of reactant B, including a variable flow, may be employed within the scope of the present disclosure. Further, it will be appreciated that reactant B exposure phase 140A may have any suitable duration. In some embodiments, reactant B exposure phase 140A may have a duration exceeding a substrate surface saturation time for reactant B. For example, the embodiment shown in FIG. 1 depicts a reactant B post-saturation exposure time 150 included in reactant B exposure phase 140A. Optionally, reactant B exposure phase 140A may include a controlled flow of a suitable inert gas, which, as described above, may assist with pressure and/or temperature control of the process station, evaporation of a liquid precursor, more rapid delivery of the precursor and may prevent back-diffusion of process station gases. In the embodiment shown in FIG. 1, an inert gas is continually supplied to the process station throughout reactant B exposure phase 140A.

In some embodiments, plasma activation of deposition reactions may result in lower deposition temperatures than in thermally-activated reactions, potentially reducing consumption of the available thermal budget of an integrated process. For example, in some embodiments, a plasma activated CFD process may occur at room temperature.

While the CFD process embodiment depicted in FIG. 1 is plasma activated, it will be appreciated that other non-thermal energy sources may be used within the scope of the present disclosure. Non-limiting examples of non-thermal energy sources include, but are not limited to, ultraviolet lamps, downstream or remote plasma sources, inductively-coupled plasmas, and microwave surface wave plasmas.

Further, while many examples discussed herein include two reactants (A and B), it will be appreciated that any suitable number of reactants may be employed within the scope of the present disclosure. In some embodiments, a single reactant and an inert gas used to supply plasma energy for a surface decomposition reaction of the reactant may be used. Alternatively, as discussed above in the context of feature 7, some embodiments may use three or more reactants to deposit a film.

In some scenarios, surface adsorbed B species may exist as discontinuous islands on the substrate surface, making it difficult to achieve surface saturation of reactant B. Various surface conditions may delay nucleation and saturation of reactant B on the substrate surface. For example, ligands released on adsorption of reactants A and/or B may block some surface active sites, preventing further adsorption of reactant B. Accordingly, in some embodiments, continuous adlayers of reactant B may be provided by modulating a flow of and/or discretely pulsing reactant B into the process station during reactant B exposure phase 140A. This may provide extra time for surface adsorption and desorption processes while conserving reactant B compared to a constant flow scenario.

Figure 2:
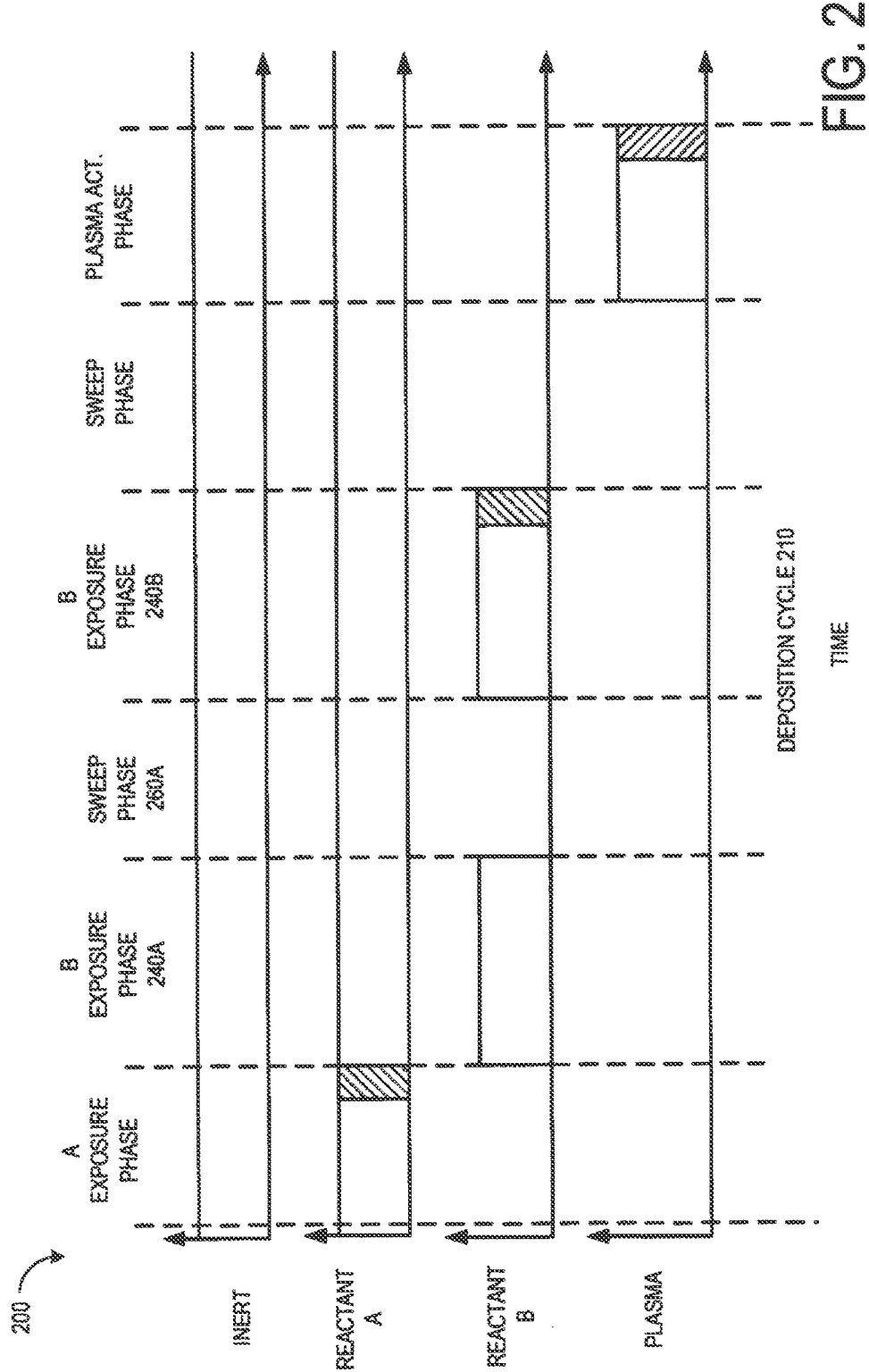
FIG. 2 schematically shows a timing diagram for another example CFD process according to an embodiment of the present disclosure.

Additionally or alternatively, in some embodiments, one or more sweep phases may be included between consecutive exposures of reactant B. For example, the embodiment of FIG. 2 schematically shows an example CFD process timing diagram 200 for a deposition cycle 210. At reactant B exposure phase 240A, reactant B is exposed to the substrate surface. Subsequently, at sweep phase 260A, reactant B is turned off, and gas phase species of reactant B are removed from the process station. In one scenario, gas phase reactant B may be displaced by a continuous flow of reactant A and/or the inert gas. In another scenario, gas phase reactant B may be removed by evacuating the process station. Removal of gas phase reactant B may shift an adsorption/desorption process equilibrium, desorbing ligands, promoting surface rearrangement of adsorbed B to merge discontinuous islands of adsorbed B. At reactant B exposure phase 240B, reactant B is again exposed to the substrate surface. While the embodiment shown in FIG. 2 include one instance of a reactant B sweep and exposure cycle, it will be appreciated that any suitable number of iterations of alternating sweep and exposure cycles may be employed within the scope of the present disclosure.

Returning to the embodiment of FIG. 1, prior to activation by the plasma at 180A, gas phase reactant B may be removed from the process station in sweep phase 160A in some embodiments. A CFD cycle may include one or more sweep phases in addition to the above-described exposure phases. Sweeping the process station may avoid gas phase reactions where reactant B is susceptible to plasma activation. Further, sweeping the process station may remove surface adsorbed ligands that may otherwise remain and contaminate the film. Examples sweep gases include, but are not limited to, argon, helium, and nitrogen. In the embodiment shown in FIG. 1, sweep gas for sweep phase 160A is supplied by the inert gas stream. In some embodiments, sweep phase 160A may include one or more evacuation subphases for evacuating the process station. Alternatively, it will be appreciated that sweep phase 160A may be omitted in some embodiments.

Sweep phase 160A may have any suitable duration. In some embodiments, increasing a flow rate of a one or more sweep gases may decrease the duration of sweep phase 160A. For example, a sweep gas flow rate may be adjusted according to various reactant thermodynamic characteristics and/or geometric characteristics of the process station and/or process station plumbing for modifying the duration of sweep phase 160A. In one non-limiting example, the duration of a sweep phase may be optimized by adjustment of the sweep gas flow rate. This may reduce deposition cycle time, which may improve substrate throughput.

A CFD cycle, typically includes an "activation phase" in addition to the exposure and optional sweep phases described above. The activation phase serves to drive the reaction of the one or more reactants adsorbed on the substrate surface. At plasma activation phase 180A of the embodiment shown in FIG. 1, plasma energy is provided to activate surface reactions between surface adsorbed reactants A and B. For example, the plasma may directly or indirectly activate gas phase molecules of reactant A to form reactant A radicals. These radicals may then interact with surface adsorbed reactant B, resulting in film-forming surface reactions. Plasma activation phase 180A concludes deposition cycle 110A, which in the embodiment of FIG. 1 is followed by deposition cycle 110B, commencing with reactant A exposure phase 120B.

In some embodiments, the plasma ignited in plasma activation phase 180A may be formed directly above the substrate surface. This may provide a greater plasma density and enhanced surface reaction rate between reactants A and B. For example, plasmas for CFD processes may be generated by applying a radio frequency (RF) field to a low-pressure gas using two capacitively coupled plates. In alternative embodiments, a remotely generated plasma may be generated outside of the main reaction chamber.

Any suitable gas may be used to form the plasma. In a first example, and inert gas such as argon or helium may be used to form the plasma. In a second example, a reactant gas such as oxygen or ammonia may be used to form the plasma. In a third example, a sweep gas such as nitrogen may be used to form the plasma. Of course, combinations of these categories of gases may be employed. Ionization of the gas between the plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for CFD processes may be formed by one or more suitable methods other than capacitive coupling of an RF field to a gas.

Plasma activation phase 180A may have any suitable duration. In some embodiments, plasma activation phase 180A may have a duration that exceeds a time for plasma-activated radicals to interact with all exposed substrate surfaces and adsorbates, forming a continuous film atop the substrate surface. For example, the embodiment shown in FIG. 1 includes a plasma post-saturation exposure time 190 in plasma activation phase 180A.

As explained more fully below, and as suggested in the discussion of feature 4 above, extending a plasma exposure time and/or providing a plurality of plasma exposure phases may provide a post-reaction treatment of bulk and/or near-surface portions of the deposited film. In one scenario, decreasing surface contamination by plasma treatment may prepare the surface for adsorption of reactant A. For example, a silicon nitride film formed from reaction of a silicon-containing reactant and a nitrogen-containing reactant may have a surface that resists adsorption of subsequent reactants. Treating the silicon nitride surface with a plasma may create hydrogen bonds for facilitating subsequent adsorption and reaction events.

In some embodiments, film properties, such as film stress, dielectric constant, refractive index, etch rate may be adjusted by varying plasma parameters, which will be discussed in more detail below. Table 3 provides an example list of various film properties for three example CFD silicon dioxide films deposited at 400 degrees Celsius. For reference purposes, Table 3 also includes film information for an example PECVD silicon dioxide film deposited at 400 degrees Celsius.

TABLE 3

| SiO₂ Process | Dep. rate (ang./cycle) | NU ((max-min)/average) | NU (1 σ) | Ref. Index | Film stress (MPa) | Dielectric constant | Wet etch rate ratio |
|---|---|---|---|---|---|---|---|
| 1 sec. 200 W O₂ plasma (HF only) | 0.9 | 5% | 2% | 1.456 | −165 | 6.6 | 7.87 |
| 10 sec. 1000 W O₂ plasma (HF only) | 0.6 | 5% | 2% | 1.466 | −138 | 3.9 | 1.59 |
| 10 sec. 1000 W O₂ plasma (HF/LF) | 0.6 | 12% | 5% | 1.472 | −264 | 3.9 | 1.55 |
| PECVD SiO₂ | 600 | 3% | 1% | 1.477 | −238 | 4.2 | 5.28 |

Figure 3:
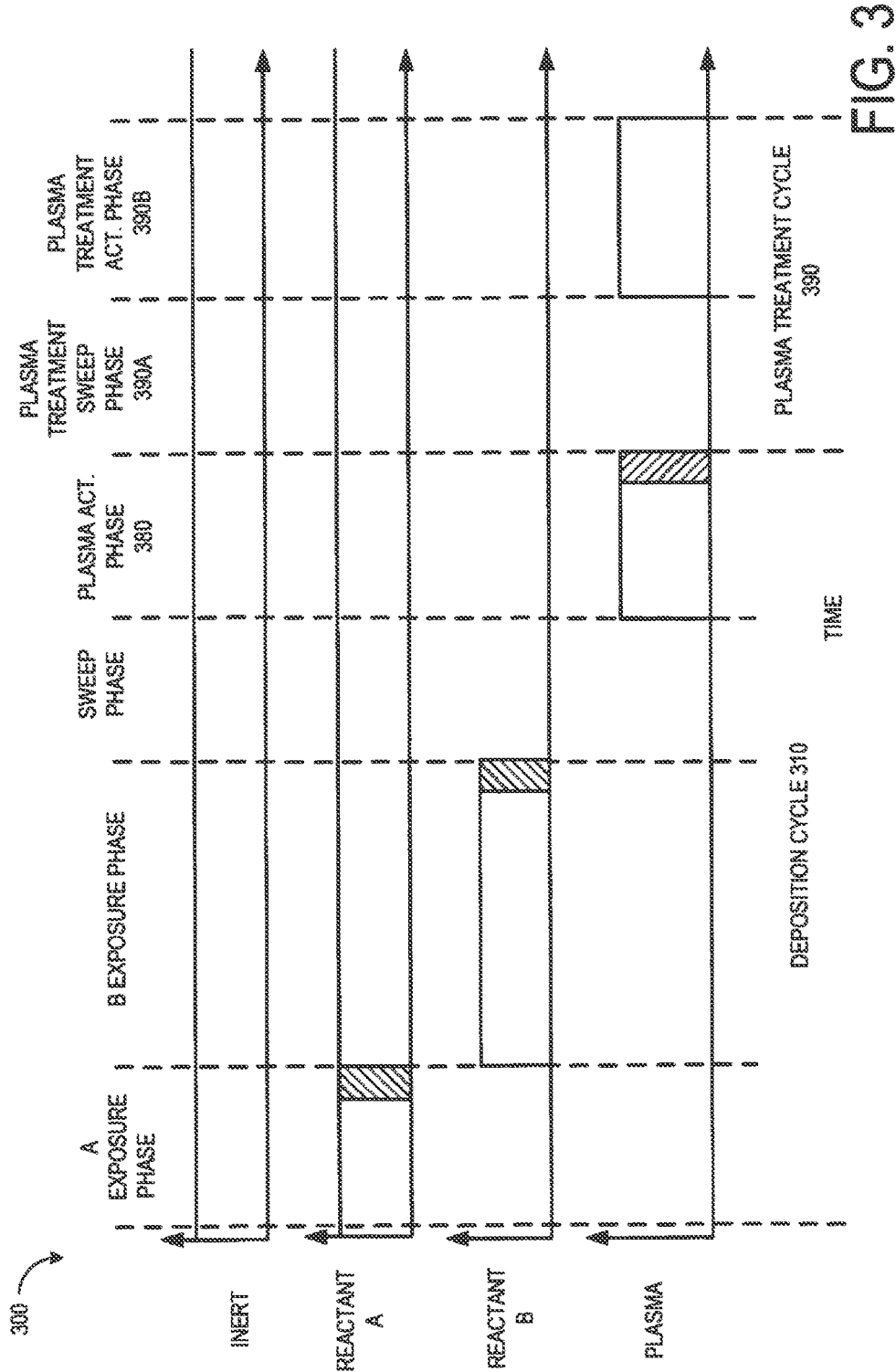
FIG. 3 schematically shows a timing diagram for another example CFD process according to an embodiment of the present disclosure.

For example, FIG. 3 schematically shows an embodiment of a CFD process timing diagram 300 including a deposition phase 310 followed by a plasma treatment phase 390. It will be appreciated that any suitable plasma may be used during a plasma treatment phase. In a first scenario, a first plasma gas may be used during activation in the deposition cycle and a second, different plasma gas may be used during a plasma treatment phase. In a second scenario, a second, different plasma gas may supplement a first plasma gas during the plasma treatment phase. Non-limiting parameter ranges for an example in-situ plasma treatment cycle are provided in Table 4.

TABLE 4

| Phase | Plasma treatment sweep phase | Plasma treatment activation phase |
|---|---|---|
| Time (sec) | 0.25-10.0 | 0.25-10.0 |
| Ar (sccm) | 1-20 | 1-20 |
| Pressure (torr) | 1-4 | 1-4 |
| Temp (C.) | 50-400 | 50-400 |
| HF Power (W) | 50-2500 | 50-2500 |
| LF Power (W) | 0-2500 | 0-2500 |

At plasma activation phase 380 shown in FIG. 3, the substrate surface is exposed to a plasma to activate a film deposition reaction. As depicted in the embodiment shown in FIG. 3, the process station is provided with a continuous flow of reactant A, which may be, e.g., an auxiliary reactant such as oxygen, and an inert gas at plasma treatment sweep phase 390A. Sweeping the process station may remove volatile contaminants from the process station. While a sweep gas is shown in FIG. 3, it will be appreciated that any suitable reactant removal method may be used within the scope of the present disclosure. At plasma treatment activation phase 390B, a plasma is ignited to treat the bulk and/or near-surface region of the newly deposited film.

Figure 4:
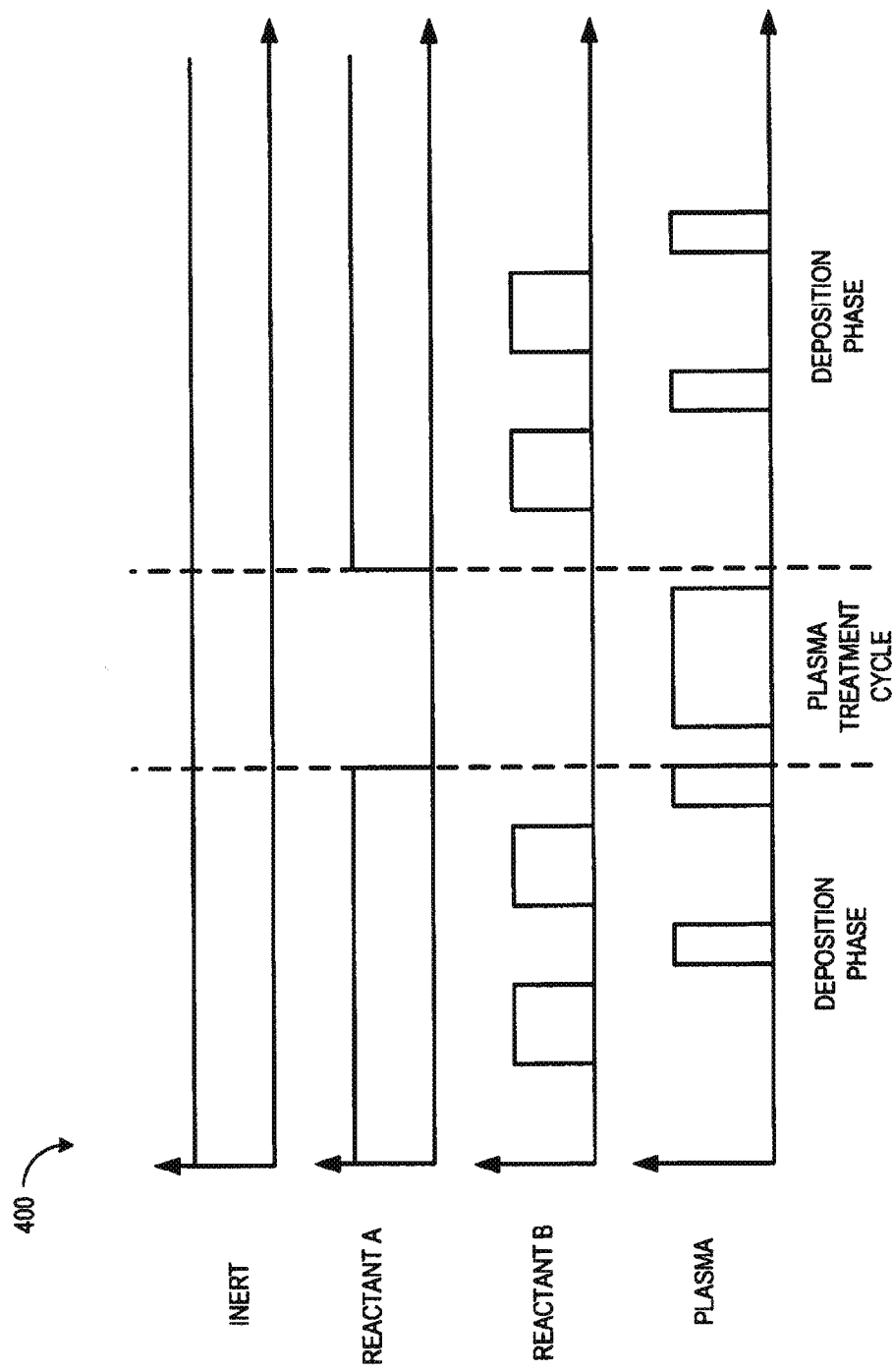
FIG. 4 schematically shows a timing diagram for an example CFD process including a plasma treatment cycle according to an embodiment of the present disclosure.

While the embodiment of FIG. 3 includes one instance of a CFD cycle including a plasma treatment phase, it will be appreciated that any suitable number of iterations may be employed within the scope of the present disclosure. Further, it will be appreciated that one or more plasma treatment cycles may be inserted at intervals (regular or otherwise) between normal deposition cycles. For example, FIG. 4 shows an embodiment of a CFD process timing diagram 400 including a plasma treatment phase inserted between two deposition cycles. While the embodiment of FIG. 4 includes a plasma treatment cycle inserted between two deposition cycles, it will be appreciated that any suitable number of deposition cycles may precede or follow one or more plasma treatment cycles. For example, in a scenario where a plasma treatment is used to alter a film density, a plasma treatment cycle may be inserted after every tenth deposition cycle. In a scenario where a plasma treatment is used to prepare a surface for adsorption and reaction events, a plasma treatment phase may be incorporated in every CFD cycle, e.g., after each CFD deposition phase.

Figure 5:
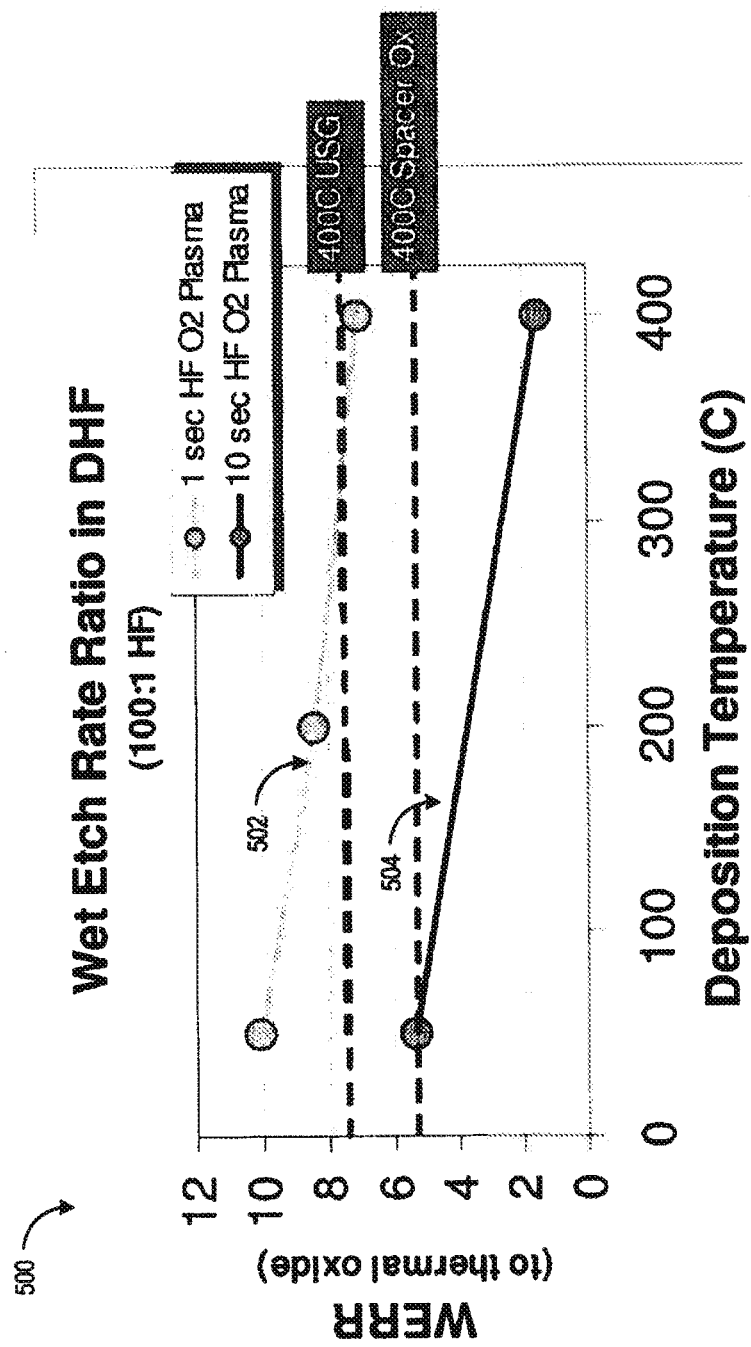
FIG. 5 shows an example correlation between a wet etch rate ratio and a deposition temperature for films deposited according to an embodiment of the present disclosure.

Plasma treatment of the deposited film may alter one or more physical characteristics of the film. In one scenario, a plasma treatment may densify a newly deposited film. Densified films may be more etch-resistant than non-densified films. For example, FIG. 5 shows an embodiment of a comparison 500 of etch rates for example CFD processed silicon dioxide films relative to thermally grown silicon dioxide films. The example film embodiments of FIG. 5 were deposited over a range of temperatures from 50 to 400 degrees Celsius by CFD processes 502 and 504. For reference, relative etch rates for undoped silicate glass (USG) and silicon dioxide spacer layers deposited by plasma-enhanced CVD processes are displayed in FIG. 5. Films produced by process 502, which included a one-second high-frequency oxygen plasma activation phase in each deposition cycle, were approximately one-half as resistant to a dilute hydrofluoric acid wet etch (100:1 H2O:HF) as film 504, which included a ten-second high-frequency oxygen plasma activation phase in each deposition cycle. Accordingly, it will be appreciated that varying one or more aspects of the plasma activation phase and/or including one or more plasma treatment cycles may vary an etch rate of a deposited film.

Figure 6:
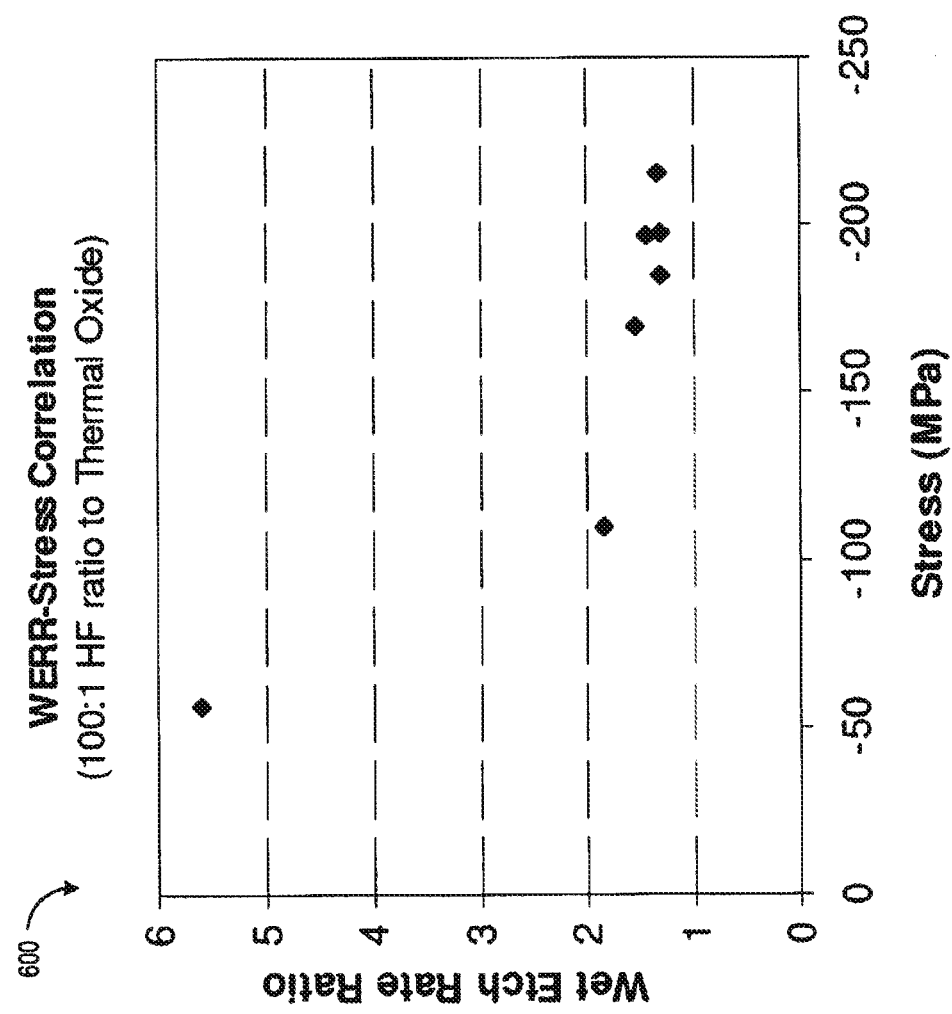
FIG. 6 shows an example correlation between a wet etch rate ratio and a film stress for films deposited according to an embodiment the present disclosure.

In another scenario, plasma treatment of a film may vary the stress characteristics of the film. For example, FIG. 6 shows an embodiment of a correlation 600 between wet etch rate ratio and film stress for example CFD silicon dioxide films. In the embodiment shown in FIG. 6, decreases in the wet etch rate ratio by, for example, extending a plasma exposure time, may increase a compressive film stress.

Figure 7:
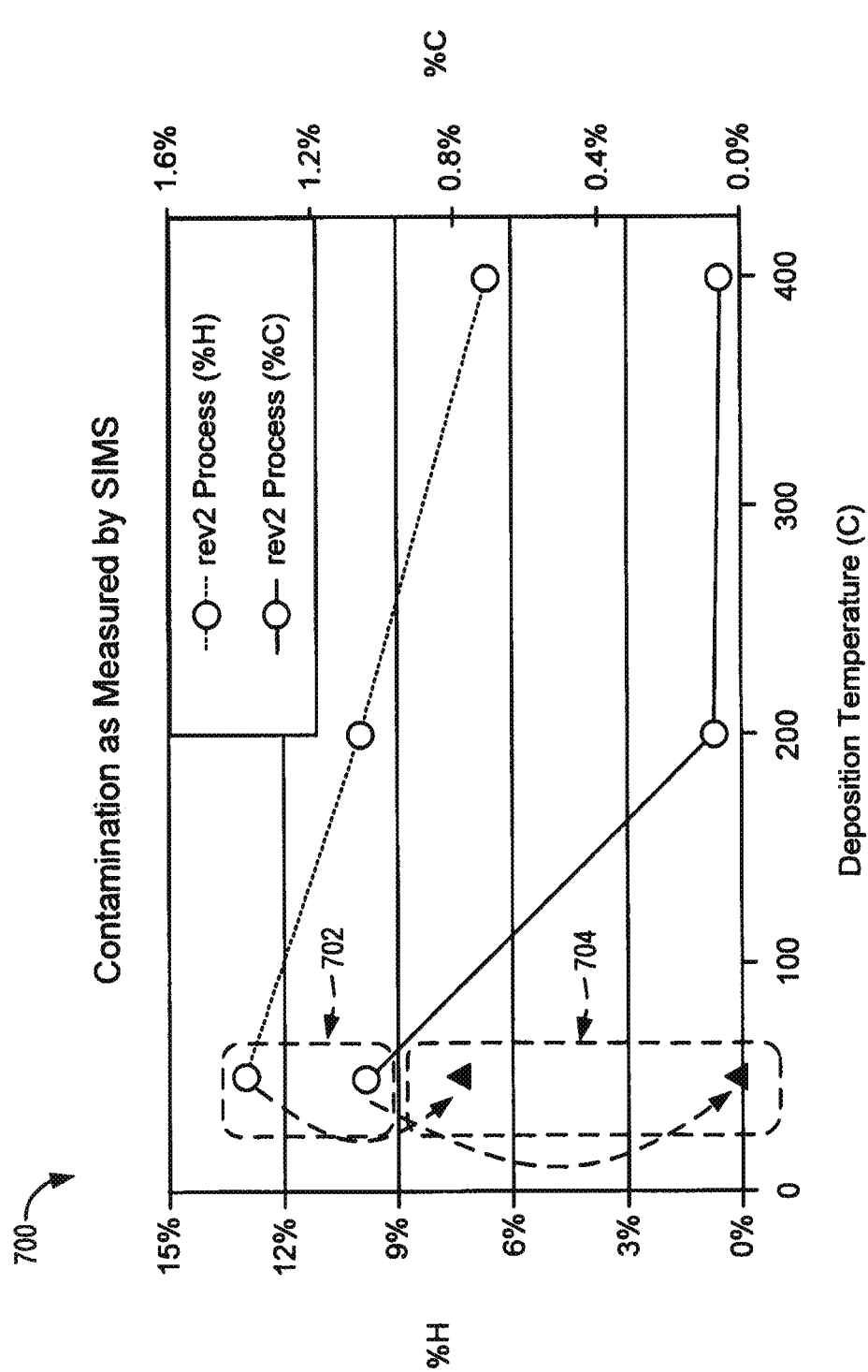
FIG. 7 shows an example correlation between film contaminant concentration and deposition temperature for films deposited according to an embodiment of the present disclosure.

In another scenario, plasma treatment of a deposited film may provide transient differential removal of trace film contaminants (e.g., hydrogen, nitrogen and/or carbon in an example silicon dioxide film) relative to other film constituents (e.g., silicon and/or oxygen in an example silicon dioxide film). For example, FIG. 7 shows an embodiment of a correlation 700 between deposition temperature, plasma exposure time, and film contaminant concentrations. In the embodiment shown in FIG. 7, a CFD silicon dioxide film 704 deposited at 50 degrees Celsius and having a ten-second oxygen plasma activation phase exhibits lower concentrations of hydrogen and carbon than a CFD silicon dioxide film 702 deposited at the same temperature but having a one-second oxygen plasma activation phase. Modifying contaminant concentrations in a film may modify electrical and/or physical properties of the film. For example, modulating carbon and/or hydrogen content may modulate a film dielectric constant and/or a film etch rate. Accordingly, it will be appreciated that varying one or more aspects of the plasma activation phase and/or including one or more plasma treatment cycles may provide an approach for varying film composition.

While the plasma treatment discussed above relates to an oxygen plasma treatment, it will be appreciated that any suitable plasma treatment may be employed without departing from the scope of the present embodiment. For example, in some embodiments a substituted amine may be employed as a nitrogen-containing reactant in a suitable CFD process in place of NH$_3$. Although replacement of NH$_3$ with a substituted amine (e.g., an alkyl amine like t-butyl amine) for conformal SiN deposition may provide a number of benefits, in some instances, the deposited film may include carbon residue originating from the alkyl amine reactant (e.g., carbon residue from the three methyl groups included each t-butyl amine molecule (NH$_2$—(CH$_3$)$_3$)). This in-film carbon may result in electrical leakage and may render the film unusable for some dielectric barrier applications.

Thus, in some embodiments, igniting a hydrogen plasma during SiN film deposition may reduce carbon residue in the SiN film, which may comparatively improve the insulating character of the film. In some examples, the reduction in carbon residue may be readily observable in FTIR spectra. For example, the SiN:C—H levels may be reduced from approximately 10% atomic to approximately 1% atomic.

Therefore, in some embodiments, a silicon nitride film may be deposited with a CFD process using an alkyl amine or a mixture of alkyl amines included in the nitrogen-containing reactant and one or more instances of a hydrogen plasma treatment. It will be appreciated that any suitable hydrogen plasma may be employed without departing from the scope of the present disclosure. Thus, in some embodiments, an admixture of H$_2$ with a gas such as He or Ar, or other H-containing gases, or active H atoms produced by a remote plasma source, may be used to treat the deposited film. Further, in some embodiments, the carbon content of the film may be tuned to any suitable concentration by varying one or more of the number of treatment pulses and their duration, the intensity of the treatment plasma, the substrate temperature, and the treatment gas composition.

While the hydrogen plasma treatment discussed above relates to a silicon nitride film, it will be appreciated that application of a suitable hydrogen plasma treatment may be used to adjust the carbon content of other CFD deposited films, including, but not limited to, SiOx, GeOx, and SiOxNy.

Certain embodiments disclosed herein pertain to ultraviolet treatment (with or without plasma treatment) of oxide CFD films. The treatment may mitigate defects in the oxide and improve electrical properties such as CV characteristics of a gate dielectric. Device and package applications employing CFD oxides that can benefit from such treatment include thru-silicon vias, logic technology employing gate oxides, shallow trench isolation (STI), thin thermal oxidation formed after STI-photoresist strip, sacrificial oxide (e.g., ~60 A) before a P-well implant, post "well" thermal oxide growth, gate/channel oxide, DRAM PMD PECVD Oxide.

In some cases, untreated CFD oxide films have been observed to have relatively poor electrical performance due to, it is believed, fixed charge in the as deposited film. For example, some films have been found to have significant within-wafer Vfb variations. Such problems have been resolved by using a post-deposition treatment with UV-radiation and/or a thermal anneal in the presence of hydrogen. It is believed that this process passivates and/or alleviates defects related to fixed charge at the (1) oxide to silicon interface or (2) within the deposited dielectric film or (3) at the air to oxide surface (surface charge). Using such treatment, the Vfb spread for as deposited oxide has been tightened from 8.3V to about 1.5V after UV cure.

While the these embodiments are primarily concerned with improving oxide films, the disclosed method may be applied generally to the growth of dielectrics, metals, metal to dielectric interface engineering. Specific dielectric materials include, for example, silicon oxides, including doped silicon oxides, silicon carbides, silicon oxycarbides, silicon nitrides, silicon oxynitrides, and ashable hard mask materials.

Examples of treatments that may be applied to improve dielectric properties include the following:

(A) Post deposition treatment of dielectric films synthesized by CFD with UV cure and then hydrogen-anneal. In the simplest embodiment, UV treatment may be used alone to reduce fixed charge.

(B) Pre-treatment of the substrate prior to CFD-dielectric film deposition with treatments including: H$_2$-plasma, N$_2$-plasma, N$_2$/H$_2$-plasma, NH$_3$-plasma, Ar-plasma, He-plasma, He anneal, H$_2$-anneal, NH$_3$-anneal, and UV cure in the presence of He, H$_2$, Ar, N$_2$, H$_2$/N$_2$-forming gas, NH$_3$. Plasma processing may be enabled with various plasma generators including, though not limited to, microwave, ICP-remote, direct and the like.

(C) Concurrent treatment (curing during deposition) with treatments including: H$_2$-plasma, N$_2$-plasma, N$_2$/H$_2$-plasma, NH$_3$-plasma, Ar-plasma, He-plasma, He anneal, H$_2$-anneal, NH$_3$-anneal, and UV cure in the presence of He, H$_2$, Ar, N$_2$, H$_2$/N$_2$-forming gas, NH$_3$. Plasma processing may be implemented with various plasma generators including, though not limited to, microwave, ICP-remote, direct and others known to those in the art. Isotropic and directional processing may be applied including, though not limited to, remote plasma, UV exposure, direct plasma, and microwave plasma. An example method includes intermittent treatment of the film between groups of CFD cycles. A group of CFD cycles may vary from about 1 to 10000 cycles. A typical scenario includes: (1) 5 cycles of CFD oxide growth followed by (2) one or more film treatments with any of the methods described above (e.g., He-plasma, UV-treatment), followed by (3) 5 cycles of CFD oxide growth. This method may be used to grow a film of any desired thickness.

(D) UV treatment imparted as byproduct by any plasma listed above (e.g., a helium plasma emits UV radiation).

One example of a procedure for in situ "cure" during the CFD cycling involves the following operations:

UV treatment via He-plasma
BTBAS dose
Purge
O2/Ar—RF plasma activation
Purge
Repeat steps 1-5 to yield a film of desired thickness.

A range of UV cure conditions may be employed in any of the listed contexts. Generally, the pedestal temperature will be maintained between about 250 and 500 C during the cure. For many device fabrication applications, the upper temperature will be limited to 450 C or even 400 C. The ambient employed during the cure may be inert or reactive. Examples of gases that may be present during the cure include helium, argon, nitrogen, forming gas, and ammonia. The flow rate of such gases may be about 2 to 20,000 sccm, preferably about 4000 to 18,000 sccm. The power of the UV lamp may, for example, about 2-10 kW, and preferably between about 3.5 and 7 kW. An appropriate duration of exposure to UV from such source is between about 20 and 200 seconds (e.g., about 90 seconds). Finally, the pressure may be held at a level between 0 Torr and about 40 Torr.

In a specific embodiment, an effective treatment of CFD oxide was obtained using the following conditions:

Pedestal temperature=400 C
Ambient=He
Pressure=40 Torr He
Flow rate=10,000 sccm

In some embodiments, a thermal anneal of the oxide is performed after the UV cure operation. In one example, the following conditions were used in the anneal:

Ped T=400 C
Ambient=H2+N2
Pressure=2.5 Torr
Flow rates=750 sccm H2; 3000 sccm N2

The physical and electrical characteristics of the deposited film may also be altered by adjusting other process parameters, such as deposition temperature. For example, correlation 700 of the embodiment depicted in FIG. 7 also shows an example relationship between CFD film deposition temperature and film contaminants concentration. As film deposition temperature increases, incorporation of film contaminants decreases. In another example, the embodiment shown in FIG. 5 illustrates that a wet etch rate ratio of example silicon dioxide CFD films decreases as deposition temperature increases, as described above. Other deposition parameters that may be adjusted to tune the film properties include RF power, RF frequency, pressure, and flow rates. Further, in some embodiments, film characteristics may be altered by altering a reactant selection. For example, a hydrogen content of a silicon dioxide film may be reduced by using tetra isocyanate silane (TICS) as a silicon-containing reactant and oxygen and/or nitrous oxide as an oxygen-containing reactant.

It will be appreciated that variation of physical and/or electrical film characteristics, like those discussed above, may provide opportunities to adjust device performance and yield, as well as opportunities to modify aspects of device manufacturing process integration. As one non-limiting example, the ability to tune etch rate characteristics of a CFD silicon dioxide film may make the film a candidate for etch stop, hard mask, and other process integration applications. Accordingly, various embodiments of CFD-produced films are provided herein for application throughout an integrated semiconductor device fabrication process.

In one scenario, a CFD process may deposit a conformal silicon dioxide film on a non-planar substrate. For example, a CFD silicon dioxide film may be used for gap fill of structures, such as a trench fill of shallow trench isolation (STI) structures. While the various embodiments described below relate to a gap fill application, it will be appreciated that this is merely a non-limiting, illustrative application, and that other suitable applications, utilizing other suitable film materials, may be within the scope of the present disclosure. Other applications for CFD silicon dioxide films include, but are not limited to, interlayer dielectric (ILD) applications, intermetal dielectric (IMD) applications, pre-metal dielectric (PMD) applications, dielectric liners for through-silicon via (TSV) applications, resistive RAM (Re-RAM) applications, and/or stacked capacitor fabrication in DRAM applications.

Doped silicon oxide may be used as a diffusion source for boron, phosphorus, or even arsenic dopants. For example, a boron doped silicate glass (BSG), a phosphorus doped silicate glass (PSG), or even a boron phosphorus doped silicate glass (BPSG) could be used. Doped CFD layers can be employed to provide conformal doping in, for example, three-dimensional transistor structures such as multi-gate FinFET's and three-dimensional memory devices. Conventional ion implanters cannot easily dope sidewalls, especially in high aspect ratio structures. CFD doped oxides as diffusion sources have various advantages. First, they provide high conformality at low temperature. In comparison, low-pressure CVD produced doped TEOS (tetraethylorthosilicate) is known but requires deposition at high temperature, and sub-atmospheric CVD and PECVD doped oxide films are possible at lower temperature but have inadequate conformality. Conformality of doping is important, but so is conformality of the film itself, since the film typically is a sacrificial application and will then need to be removed. A non-conformal film typically faces more challenges in removal, i.e. some areas can be overetched. Additionally, CFD provides extremely well controlled doping concentration. As mentioned, a CFD process can provide from a few layers of undoped oxide followed by a single layer of doping. The level of doping can be tightly controlled by the frequency with which the doped layer is deposited and the conditions of the doping cycle. In certain embodiments, the doping cycle is controlled by for instance using a dopant source with significant steric hindrance. In addition to conventional silicon-based microelectronics, other applications of CFD doping include microelectronics and optoelectronics based on III-V semiconductors such as GaAs and II-VI semiconductors such as HgCdTe, photovoltaics, flat panel displays, and electrochromic technology.

Figure 8:
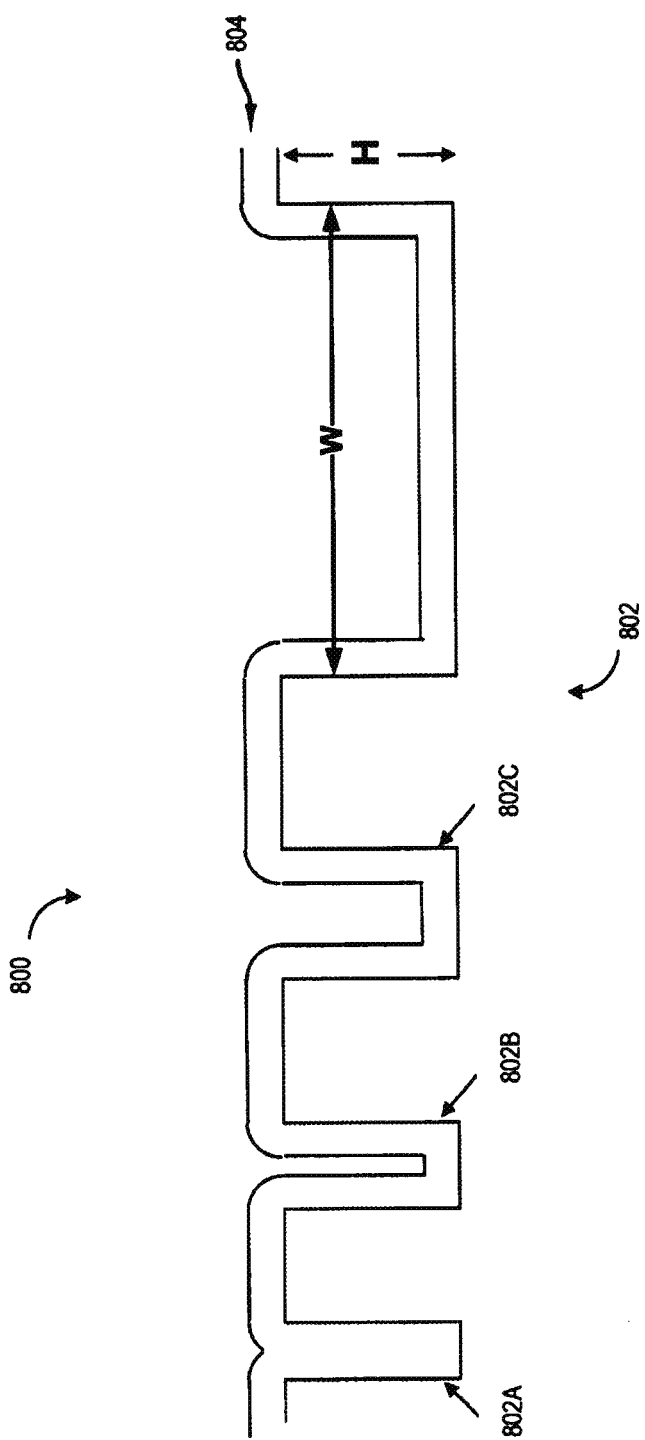
FIG. 8 schematically shows an example cross-section of a non-planar substrate comprising a plurality of gaps.

Some gap fill processes involve two film deposition steps performed on different deposition tools, requiring a vacuum break and air exposure between deposition processes. FIG. 8 schematically shows an example non-planar substrate 800 including a plurality of gaps 802. As depicted in FIG. 8, gaps 802 may have varying aspect ratios, which may be defined as a ratio of gap depth (H) to gap width (W) for each gap 802. For example, a logic area of an integrated semiconductor device may have varying gap aspect ratios corresponding to different logic device structures.

As depicted in FIG. 8, non-planar substrate 800 is covered by a thin, conformal film 804. While conformal film 804 has completely filled gap 802A, gaps 802B and 802C remain open. Closing gaps 802B and 802C with a conformal film may lead to extended process times. Thus, in some approaches, a thicker film may be deposited ex-situ by a higher deposition rate process, such as a CVD and/or PECVD method. However, ex-situ deposition of gap fill films may reduce wafer throughput in a production line. For example, substrate handling and transfer time between a deposition tools may reduce a number of substrate processing activities during a production period. This may diminish production line throughput and may require the installation and maintenance of additional process tools in the production line.

Figure 10:
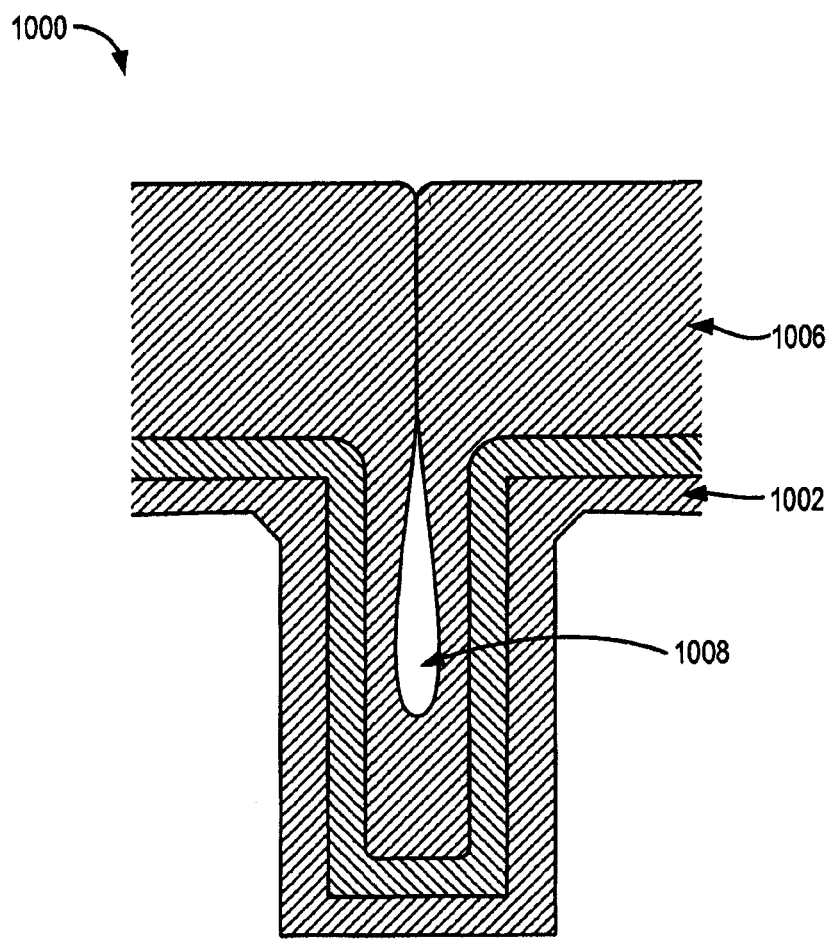
FIG. 10 schematically shows an example cross-section of a gap fill including a keyhole void.

Further, while gap 802C may have an aspect ratio suitable for a gas-phase deposition process, 802B may have an aspect ratio that may lead to incomplete filling by a higher deposition rate process and may form a keyhole void. For example, FIG. 10 shows an example high aspect ratio structure 1000 formed in substrate 1002. As depicted in FIG. 10, bread loafing effects during the deposition of thicker film 1006 have produced keyhole void 1008. Keyhole voids may be re-opened and filled with conductive films in subsequent processes, which may lead to device shorting.

Figure 9:
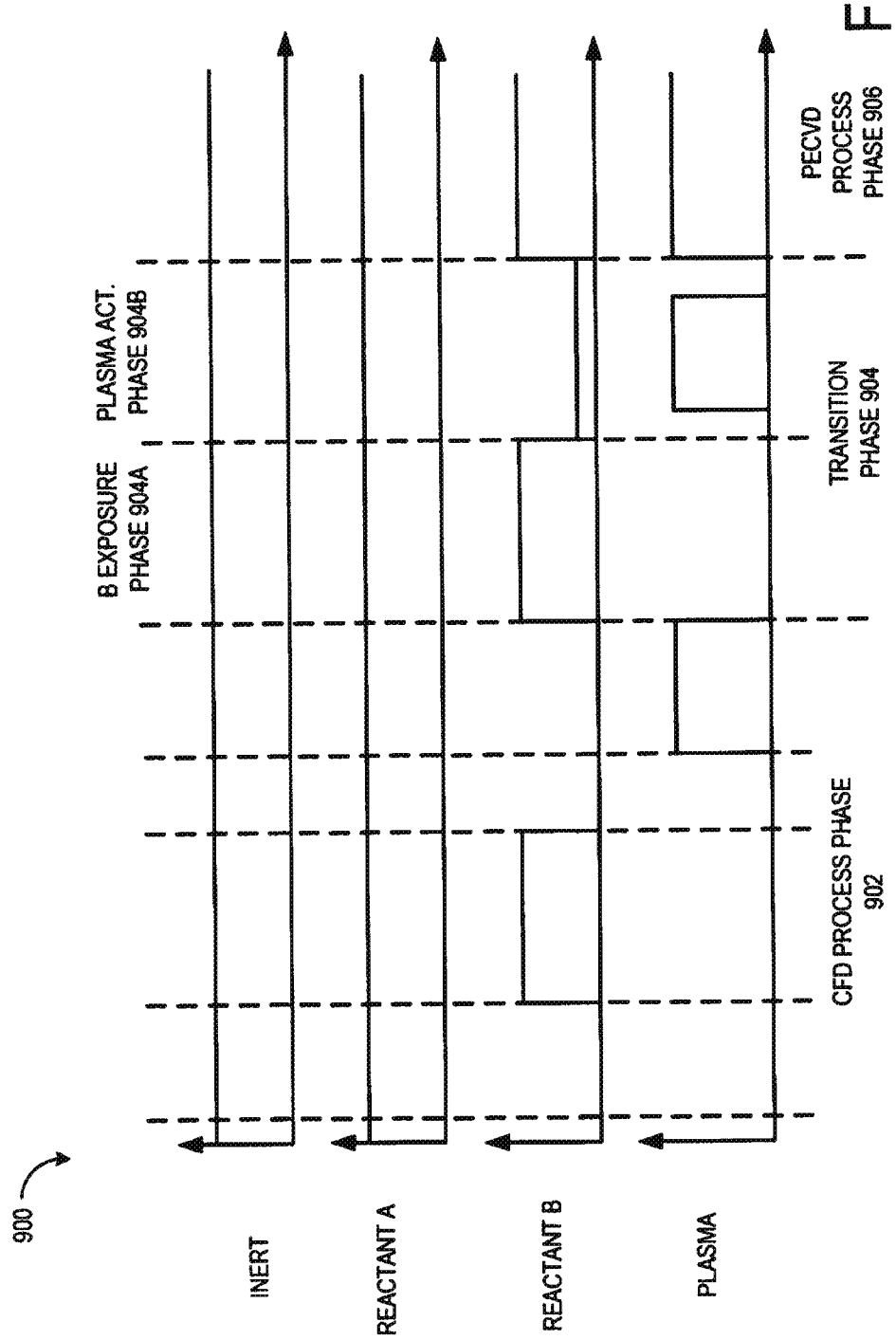
FIG. 9 schematically shows a timing diagram for an example CFD process including a transition to a PECVD process according to an embodiment of the present disclosure.

Some approaches to addressing high aspect ratio gaps such as gap 802B include providing device design rules that avoid creation of such gaps. However, such design rules may require additional masking steps, may make device design difficult, and/or may lead to increased integrated semiconductor device area, which may increase manufacturing cost. Thus, in some embodiments, a CFD process may include an in-situ transition from a CFD process to a CVD and/or a PECVD process. For example, FIG. 9 shows an embodiment of a CFD process timing diagram 900 that has been divided into three phases. CFD process phase 902 depicts an example CFD process cycle. For clarity, a single CFD process cycle is shown in the embodiment depicted in FIG. 9, though it will be appreciated that any suitable number of CFD process cycles and plasma treatment cycles may be included in CFD process phase 902. A transition phase 904 follows CFD process phase 902. As depicted in the embodiment of FIG. 9, transition phase 904 includes aspects of both a CFD process and a PECVD process. Specifically, reactant B is provided to the process station past the end of reactant B exposure phase 904A so that reactants A and B are both present in the gas phase during plasma activation phase 904B. This may provide PECVD-type gas phase reactions concurrently with CFD-type surface reactions. While transition phase 904 includes only one iteration of reactant B exposure phase 904A and plasma activation phase 904B, it will be appreciated that any suitable number of iterations may be included within a transition phase.

In some embodiments, a plasma generator may be controlled to provide intermittent pulses of plasma energy during plasma activation phase 904B. For example, the plasma may be pulsed at one or more frequencies including, but not limited to, frequencies between of 10 Hz and 150 Hz. This may enhance step coverage by reducing a directionality of ion bombardment in comparison to a continuous plasma. Further, this may reduce ion bombardment damage to the substrate. For example, photoresist substrates may be eroded by ion bombardment during a continuous plasma. Pulsing the plasma energy may reduce photoresist erosion.

In the embodiment shown in FIG. 9, the flow rate of reactant B during plasma activation phase 904B is less than the flow rate of reactant B during reactant B exposure phase 904A. Thus, reactant B may be "trickled" into the process station during plasma activation phase 904B. This may provide a gas-phase PECVD reaction supplementing the CFD-type surface reactions. However, it will be appreciated that, in some embodiments, flow rate of reactant B may be varied during a single plasma activation phase or over the course of a transition phase. For example, in a transition phase including two iterations of reactant B exposure and plasma activation, a flow rate of reactant B during a first plasma activation phase may be lower than a flow rate of reactant B during the second plasma activation phase. Varying a flow rate of reactant B during plasma activation phase 904B may provide a smooth transition from the step-coverage characteristics of CFD process phase 902 to the deposition rate characteristics of PECVD process phase 906.

In some embodiments, a CFD process may include an in-situ etch for selectively removing a re-entrant portion of deposited film. Non-limiting parameter ranges for an example silicon dioxide deposition process including an in-situ etch for a gap fill CFD process are provided in Table 5.

TABLE 5

| Phase | Reactant A exposure phase | Reactant B exposure phase | Sweep phase | Plasma activation phase | Etch hase |
|---|---|---|---|---|---|
| Time (sec) | continuing | 0.25-10.0 | 0.25-10.0 | 0.25-10.0 | 0.25-10.0 |
| BTBAS (sccm) | — | 0.5-2.0 | 0 | 0 | 0 |
| $O_2$ (slm) | 1-20 | 1-20 | 1-20 | 1-20 | 0 |
| $NF_3$ (sccm) | 0 | 0 | 0 | 0 | 1-15 |
| Ar (slm) | 1-20 | 1-20 | 1-20 | 1-20 | 1-20 |
| Pressure (torr) | 1-4 | 1-4 | 1-4 | 1-4 | 1-4 |
| Temp (C.) | 50-400 | 50-400 | 50-400 | 50-400 | 50-400 |
| HF Power | 0 | 0 | 0 | 50-2500 | 50-2500 |

TABLE 5-continued

| Phase | Reactant A exposure phase | Reactant B exposure phase | Sweep phase | Plasma activation phase | Etch hase |
|---|---|---|---|---|---|
| (W) | | | | | |
| LF Power (W) | 0 | 0 | 0 | 0-2500 | 0-2500 |

Figure 11:
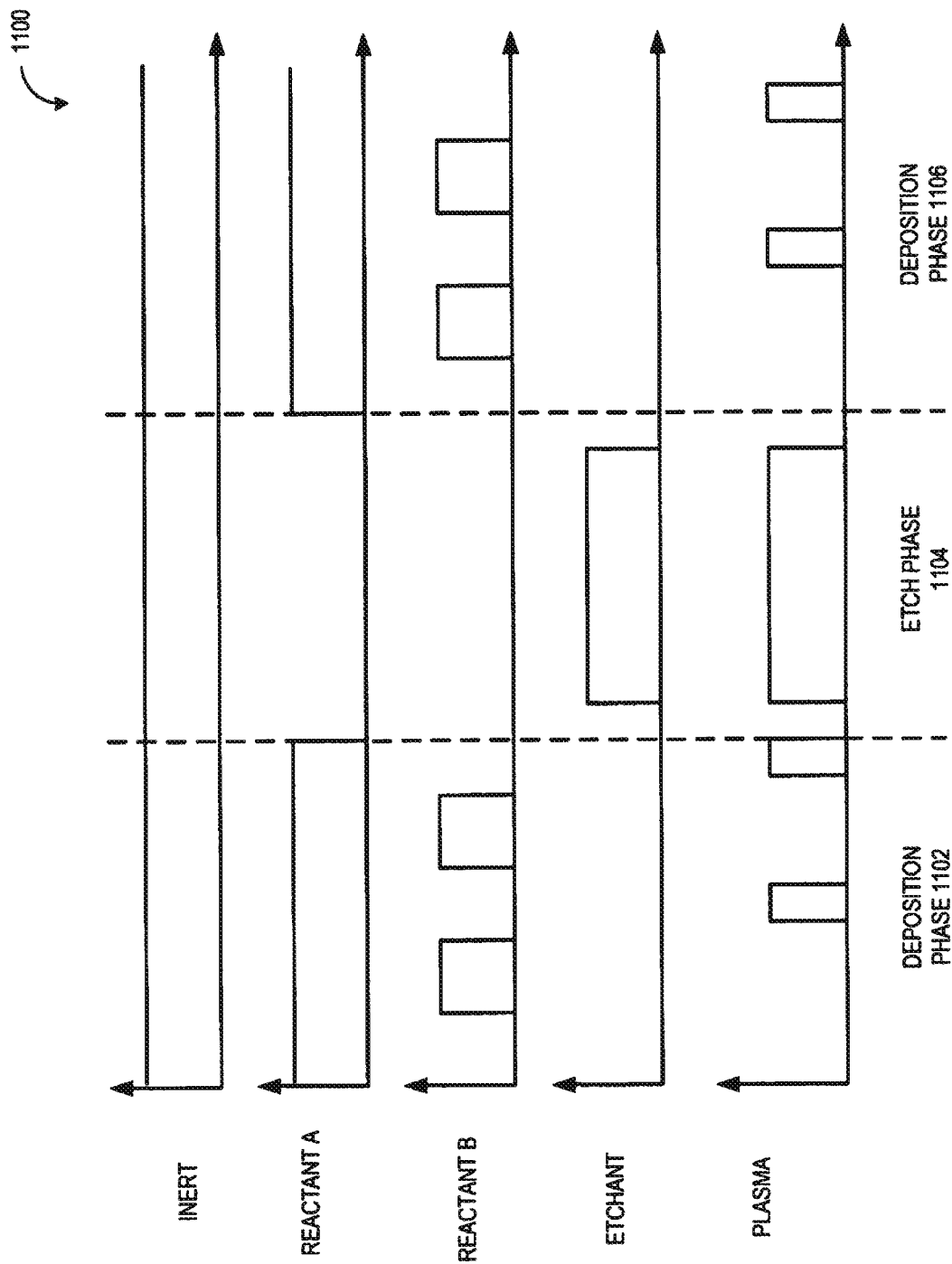
FIG. 11 schematically shows a timing diagram for an example CFD process including an in-situ etch according to an embodiment of the present disclosure.

FIG. 11 shows an embodiment of a CFD process timing diagram 1100 including a deposition phase 1102, an etch phase 1104, and a subsequent deposition phase 1106. At deposition phase 1102 of the embodiment shown in FIG. 11, film is deposited onto the exposed surfaces of the substrate. For example, deposition phase 1102 may include one or more CFD process deposition cycles.

At etch phase 1104 of the embodiment of FIG. 11, reactants A and B are turned off and an etch gas is introduced to the process station. One non-limiting example of an etch gas is nitrogen trifluoride (NF3). In the embodiment depicted in FIG. 11, the etch gas is activated by a plasma ignited during etch phase 1104. Various process parameters, such as process station pressure, substrate temperature, etch gas flow rate, may be adjusted during etch phase 1104 for selectively removing a re-entrant portion of a deposited film on a non-planar substrate. Any suitable etch process may be employed within the scope of the present disclosure. Other example etch processes include, but are not limited to, reactive ion etching, non-plasma vapor phase etching, solid phase sublimation, and adsorption and directional activation (e.g., by ion bombardment) of the etch species.

In some embodiments, incompatible gas phase species may be removed from the process station before and after etching the film. For example, the embodiment of FIG. 11 includes a continuous flow of an inert gas after reactants A and B have been turned off and after the etch gas has been turned off during etch phase 1104.

At the conclusion of etch phase 1104, a deposition phase 1106 begins, further filling gaps on the non-planar substrate. Deposition phase 1106 may be any suitable deposition process. For example, deposition phase 1106 may include one or more of a CFD process, a CVD process, a PECVD process, etc. While the embodiment of FIG. 11 shows a single etch phase 1104, it will be appreciated that a plurality of in-situ etch processes may be inserted at intervals among multiple deposition phases of any suitable type during a gap fill process.

Figure 12A:
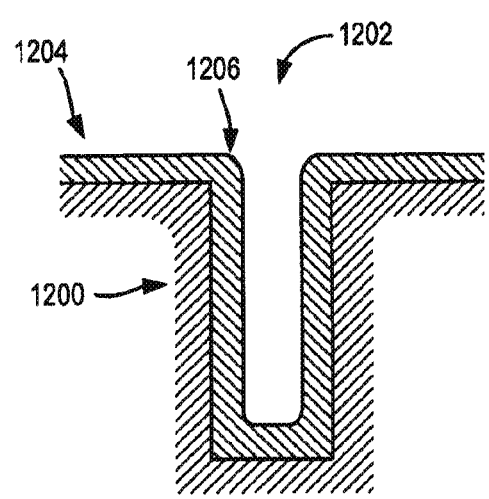
FIG. 12A schematically shows an example cross-section of a re-entrant gap fill profile.
Figure 12B:
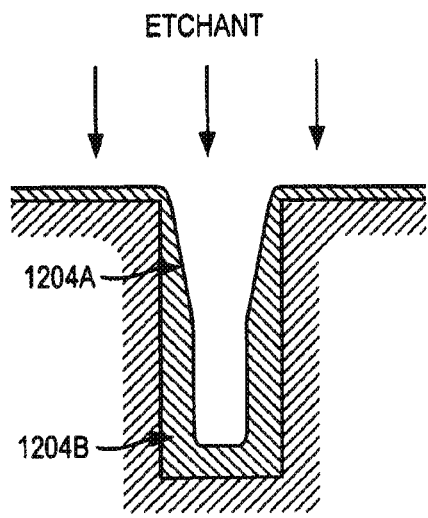
FIG. 12B schematically shows an example cross-section of the re-entrant gap fill profile of FIG. 12A during an in-situ etch process according to an embodiment of the present disclosure.
Figure 12C:
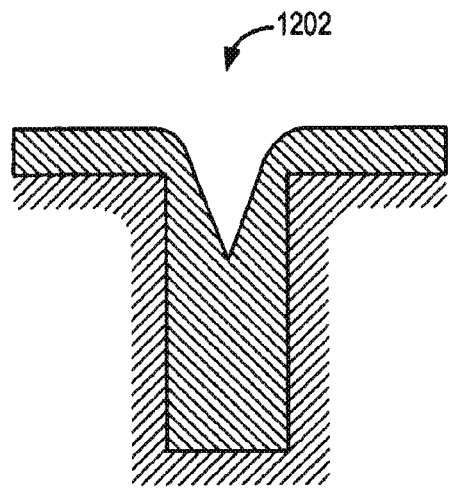
FIG. 12C schematically shows an example cross-section of the gap fill profile of FIG. 12B during a deposition process after an in-situ etch according to an embodiment of the present disclosure.

FIGS. 12A-C depict example cross-sections of a non-planar substrate at various phases of an embodiment of the in-situ deposition and etch processes described above. FIG. 12A shows a cross-section of an example non-planar substrate 1200, including a gap 1202. Gap 1202 is covered with a thin film 1204. Thin film 1204 is nearly conformal with gap 1202, but thin film 1204 includes a re-entrant portion 1206 near the top of gap 1202.

In the embodiment depicted in FIG. 12B, re-entrant portion 1206 of thin film 1204 has been selectively removed and that an upper region 1204A of thin film 1204 is thinner than a lower region 1204B. Selective removal of the re-entrant portion and/or sidewall angle adjustment may be achieved by imposing mass transfer limitations and/or lifetime limitations on the active etch species. In some embodiments, selective etching at the top of gap 1202 may also adjust a sidewall angle of gap 1202, so that gap 1202 is wider at the top than at the bottom. This may further reduce bread loafing effects in subsequent deposition phases. In the embodiment shown in FIG. 12C, after a subsequent deposition phase, gap 1202 is nearly filled and exhibits no voids.

Figure 15:
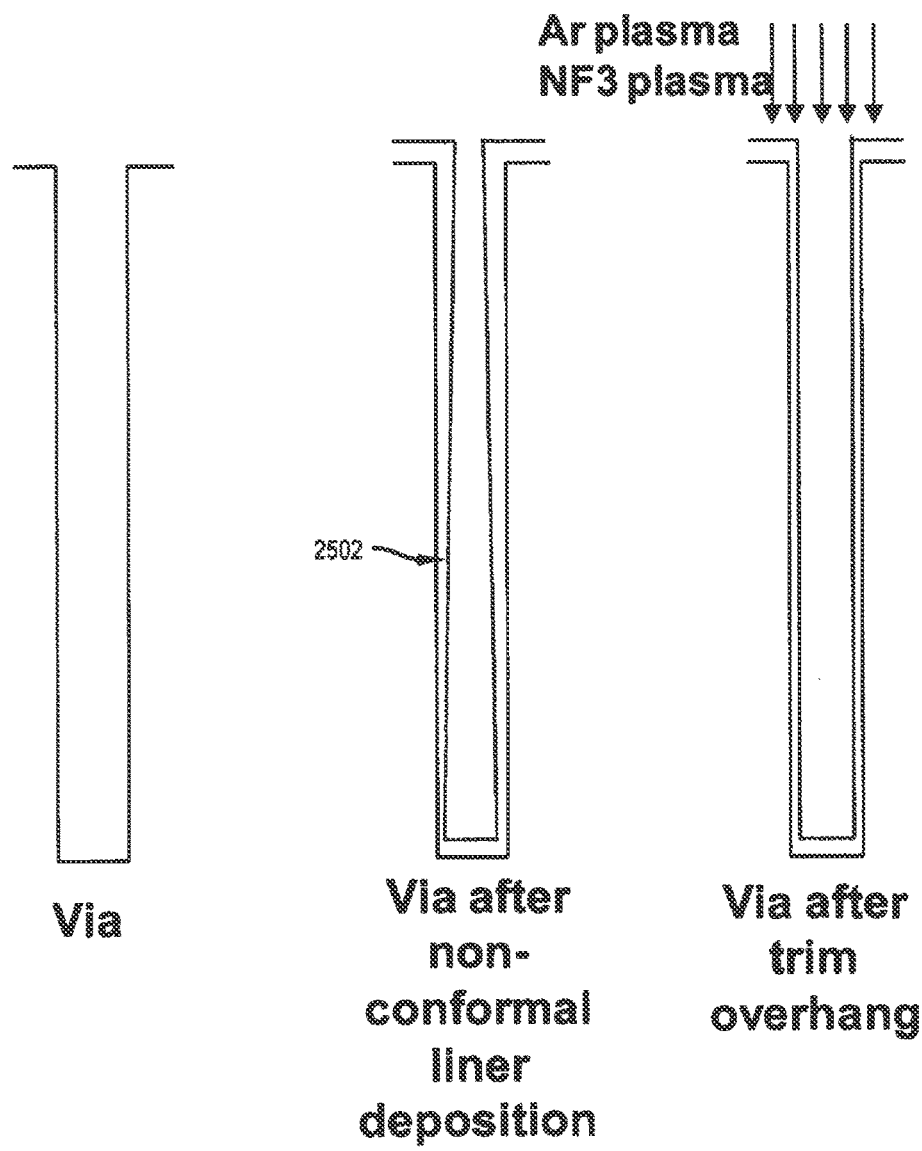
FIG. 15 schematically shows an example cross-sectional view of a through-silicon via during a CFD process including an in-situ etch according to an embodiment of the present disclosure.

Another embodiment of an in-situ etch process is shown in FIG. 15, which depicts a through-silicon via (TSV) for a copper electrode. Some example TSVs have depths of approximately 105 microns and diameters of approximately 6 microns, giving an approximately 17.5:1 aspect ratio, and may have a thermal budget ceiling of approximately 200 degrees Celsius. As shown in the embodiment of FIG. 15, through-silicon via is covered by a dielectric isolation layer 2502 to electrically isolate a silicon substrate from a metal-filled via. Example dielectric isolation layer materials include, but are not limited to, silicon oxide, silicon nitride, a low-k dielectric material. In some embodiments, the example etch processes described above may be supplemented with physical sputtering of the re-entrant portion using a suitable sputter gas, such as argon.

Other example applications for CFD films include, but are not limited to conformal low-k films (e.g., k approximately 3.0 or lower in some non-limiting examples) for back-end-of-line interconnect isolation applications, conformal silicon nitride films for etch stop and spacer layer applications, conformal antireflective layers, and copper adhesion and barrier layers. Many different compositions of low-k dielectrics for BEOL processing can be fabricated using CFD. Examples include silicon oxides, oxygen doped carbides, carbon doped oxides, oxynitrides, and the like.

In another example, in one integrated process scenario, a silicon dioxide spacer layer may be deposited over a photoresist "core." Use of a photoresist core instead of an alternative core material (such as a silicon carbide layer) may eliminate a patterning step in the integrated process. The process may involve patterning photoresist using normal lithographic techniques and then depositing a thin layer of CFD oxide directly over that core. A directional dry etch process may be then used to remove the CFD oxide film at the top of the patterned photoresist and at the bottom leaving only material along the sidewall of the patterned photoresist (consider trenches). At this stage, simple ashing can be used to remove the exposed core leaving behind the CFD oxide. Where once there was a single photoresist line, now there are two CFD-oxide lines. In this manner the process doubles the pattern density; hence it is sometimes referred to as "double patterning". Unfortunately, use of a photoresist core may limit a spacer layer deposition temperature to less than 70 degrees Celsius, which may be less than deposition temperatures for conventional CVD, PECVD, and/or ALD processes. Thus, in some embodiments, a low temperature CFD silicon dioxide film may be deposited at temperatures below 70 degrees Celsius. It will be appreciated that other potential integrated process applications exist for suitable CFD-generated films within the scope of the present disclosure. Additionally, in various embodiments, a nitride such as a silicon nitride deposited as above may be employed as a conformal diffusion barrier layer and/or etch stop in various stages of semiconductor device manufacture.

While the various CFD deposition processes described above have been directed at depositing, treating, and/or etching single film types, it will be appreciated that some CFD processes within the scope of the present disclosure may include in-situ deposition of a plurality of film types. For example, alternating layers of film types may be deposited in-situ. In a first scenario, a double spacer for a gate device may be fabricated by in-situ deposition of a silicon nitride/silicon oxide spacer stack. This may reduce cycle time and increase process station throughput, and may avoid interlayer defects formed by potential film layer incompatibility. In a second scenario, an antireflective layer for lithographic patterning applications may be deposited as a stack of SiON or amorphous silicon and SiOC with tunable optical properties.

In certain embodiments, a doped dielectric layer is formed by a conformal film deposition process. The layer typically includes a silicon oxide or silicon nitride base material or matrix which is doped with carbon and/or nitrogen. Many useful doped dielectric layer compositions may be provided by carefully tuning the amount and timing of carbonaceous or nitrogenous dopant delivered during CFD. The resulting doped conformal films may be silicon oxycarbides (sometimes termed oxygen doped silicon carbides), silicon oxynitrides (SiON), nitrogen doped silicon carbides (SiCN), and the like. These layers have numerous applications in integrated circuits and other devices. Examples include dielectric liners, gate electrode spacers, and input/output gate oxides.

Figure 16:
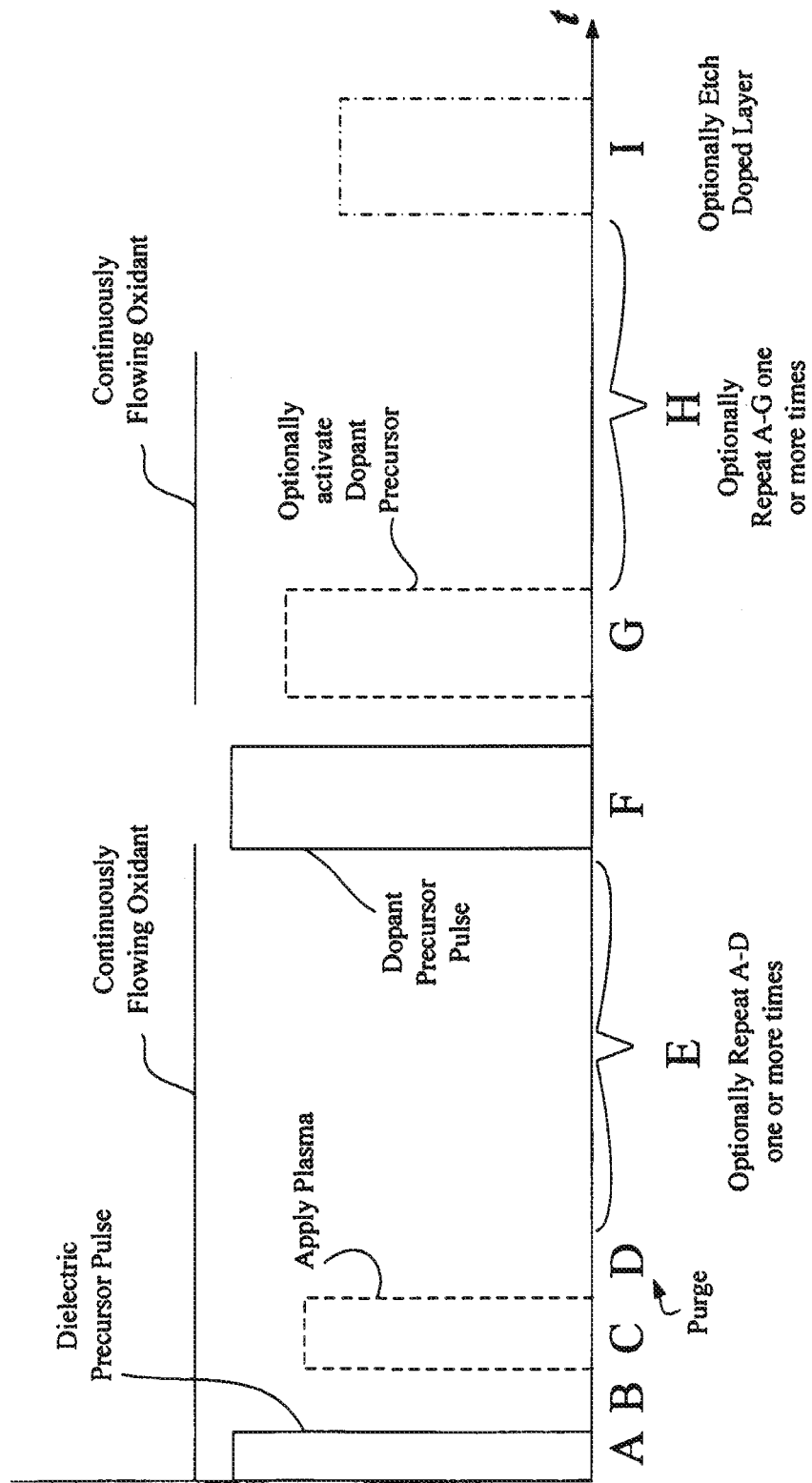
FIG. 16 presents a baseline CFD sequence of operations for depositing a doped dielectric film.

FIG. 16 presents a baseline CFD sequence of operations from left to right with advancing time presented along the x axis. Numerous variations are supported, and this figure is presented for purposes of illustration only. Initially in the depicted sequence—during an operation labeled "A"—a dielectric precursor is temporarily introduced into a reaction chamber, which chamber contains the substrate onto which the CFD film is to be deposited. The duration of operation A is chosen to allow the precursor to adsorb onto the substrate surface in an amount sufficient to support one cycle of film growth. In some embodiments, the precursor is provided in an amount that fully saturates the substrate surface.

The type of precursor is chosen for its ability to produce an undoped dielectric of the desired composition. The precursor may be introduced in a vapor phase together with an oxidant. In some embodiments, the oxidant is initially delivered to the reaction chamber and its flow is established prior to delivery of the dielectric precursor. Further, the underlying substrate surface may be first treated with a dopant containing compound prior to exposure to the dielectric precursor. Examples of such embodiments are discussed below.

Examples of suitable oxidants include elemental oxygen (e.g., $O_2$ or $O_3$), nitrous oxide ($N_2O$), water, and carbon dioxide. The oxidant is typically delivered to the reaction chamber together with a carrier gas such as an inert gas (e.g., argon) or nitrogen.

In one example, BTBAS or BDEAS (where BDEAS is bisdiethylaminosilane or $(Et_2N)_2SiH_2$) serves as the precursor for producing a silicon oxide (such as a silicate glass). Other examples include various other bisalkylaminosilanes, where the alkyl groups may contain 1-6 carbon groups. Each amine group may be, separately, mono or di-substituted with alkyl groups. Alkenyl and alkynyl variations may be employed. In some cases, different alkyl groups may be employed on the molecule (e.g., one amine may be substituted with a methyl group and the other amine may be substituted with an ethyl group. In certain embodiments, the one or more alkyl groups provides steric hindrance of the silane core.

In the case of silicon nitride CFD films, BTBAS or a similar silicon and nitrogen containing compounds are examples of suitable precursors. In another example, a combination of silicon and nitrogen containing precursors (such as silane and tert-butylamine) is sometimes used to produce silicon nitride. Examples of some additional suitable silicon nitride precursors and their deposition conditions are provided in US patent application Ser. No. 13/084, 305, filed Apr. 11, 2011, which is incorporated herein by reference in its entirety. Specific examples include tetraethyl orthosilicate ($C_8H_{20}O_4Si$), and analogues thereof (e.g., $Si(OR)_4$, where R may be any suitable alkyl group, such as a methyl group, an ethyl group, a propyl group, etc.); alkoxysilanes such as methyltriethoxysilane (MTEOS); methyltrimethoxysilane (MTMOS), dimethyldimethoxysilane (DMDMOS), trimethylmethoxysilane (TMMOS), dimethyldiethoxysilane (DMDEOS); alkylsilanes such as Tetramethylsilane (4MS); Trimethylsilane (3MS); Dimethylsilane (2MS); cyclic siloxanes such as 2,4,6,8-Tetramethylcyclotetrasiloxane (TOMCAT), octamethylcyclotetrasiloxane (OMCAT), tetravinyltetramethylcyclotetrasiloxane (TVTMCTS); alkynylsilanes such as Trimethylsilylacetylene (TMSA); dichlorosilane, trichlorosilane and mixtures of these precursorsTEOS). These compounds are used with nitriding co-reactants. As discussed in Ser. No. 13/084,305, examples of such co-reactants include tert-butylamine (TBA), triethylamine ($Et_3N$), trimethylamine ($Me_3N$), ammonia, tert-amylamine, isopropylamine, and the like.

At the conclusion of operation A, the flow of dielectric precursor into the chamber is terminated and an operation B begins as depicted. During operation B, the oxidant which was introduced into the chamber during phase A continues to flow and serves to purge the chamber of precursor. In certain embodiments, the oxidant continues to flow at the same rate as during operation A.

After the purge is completed during operation B, the precursor is reacted on the substrate surface to form a portion of the dielectric film (see operation C). In various embodiments, a plasma is applied to drive the reaction of the adsorbed dielectric precursor. In some examples, this reaction is an oxidation reaction. Some of the oxidant previously flowing into the reaction chamber is adsorbed onto the surface along with the dielectric precursor, thus providing an immediately available oxidizing agent for the plasma-mediated surface reaction. After the surface reaction is complete, the plasma or other source of activation energy is turned off and the reactor is again purged by continuously flowing oxidant. See operation D.

Operations A through D collectively provide a single cycle of the dielectric film deposition process. It should be understood that other CFD cycle sequences described herein may be used in place of the basic cycle depicted here. In the depicted embodiment, the deposition cycle (A through D) is performed without introduction of any dopant species. In various embodiments, the cycle represented by operations A through D is repeated one or more times in succession prior to introduction of a dopant species. This is illustrated in phase E of FIG. 16. In some examples, operations A-D are repeated at least once, or at least twice, or at least five times, prior to introduction of a dopant. As an example, the dielectric is deposited at a rate of about 0.5 to 5 Angstroms/cycle or about 0.8-1.2 Angstroms/cycle, or about 0.9-1.1 Angstroms/cycle. Through each of the one or more cycles (repetitions of A-D) of the depicted embodiment, the oxidant continues to flow into the reaction chamber.

At some point in the process, the cycles of dielectric deposition are interrupted by introduction of a dopant species such as, e.g., a hydrocarbon. This is illustrated as an operation F in the figure. When carbides or carbon doped dielectrics are to be formed, examples of dopant species for the dielectric source film includes one or more hydrocarbons (alkanes, alkenes, alkynes, and aromatic hydrocarbons), alcohols, ketones, aldehydes, ethers, esters, carboxylic acids, oxolanes, furans, and the like. Specific examples of such dopant species include methane, ethane, propane, acetylene, ethylene, propylene, t-amyl alcohol, ethanol, propanol, ethyleneglycol, propyne, and the like. Examples of nitrogenous doping species that may be provided in the dielectric source film include inorganic and organic compounds such as ammonia, amines (primary, secondary, tertiary, and quaternary), nitriles, amides, nitrogen-containing heterocyclic compounds (including azoles, pyrroles, etc.), amino alcohols, and the like. Specific examples of such doping species include ammonia, hydrazine, elemental nitrogen ($N_2$), acetonitrile, tert-butylamine, ethanolamine, and the like. Examples of nitrogen-containing carbonaceous doping species that may be provided in the dielectric source film include amines, nitriles, amides, nitrogen-containing heterocyclic compounds, substituted hydrazines, amino alcohols, and the like. Specific examples of such doping species include acetonitrile, tert-butylamine, ethylamine, dimethylhydrazine triethylamine, and the like.

In a specific embodiment, the dopant species is provided to the reaction chamber in mixture with a carrier gas such as an inert gas (e.g., argon or helium), but not with an oxidant or other reactant. In other embodiments, the oxidant used in the basic cycle continues to flow during delivery of the dopant species but at a reduced rate. Thus, in this baseline example, flow of the oxidant is reduced or ceases during operation F. In other embodiments, the precursor is introduced together with a reducing agent or an oxidizing agent.

The dopant species is supplied under conditions suitable for efficiently delivery to the substrate. As an example, the dopant species may be delivered to a chamber having a total pressure of about 0.5-5 Torr. In some embodiments, the substrate temperature ranges from about 100-550 C, or about 350-450 C, during delivery of the dopant species.

In certain embodiments, the dopant species attaches to the substrate surface by a surface limited mechanism, as with ALD. In alternative embodiments, the precursor may deposit by CVD-type process rather than an ALD (surface adsorption limited) process.

Optionally the dopant precursor is purged from the reaction chamber prior to further processing of the dielectric film. Additionally, as depicted in the FIG. 16, delivery of the dopant precursor is followed by an optional activation operation G, which may be mediated by plasma, elevated temperature, etc. In the example of a hydrocarbon as the dopant species, the activation operation converts the hydrocarbon to elemental carbon or, more generally, to carbon in a form which directly incorporates into the partially formed dielectric film. In certain embodiments, plasma activation involves RF power of any frequency suitable for incorporating carbon into the film. In some embodiments, the RF power supply may be configured to control high- and low-frequency RF power sources independently of one another. Example low-frequency RF powers may include, but are not limited to, frequencies between about 200 kHz and 1000 kHz. Example high-frequency RF powers may include, but are not limited to, frequencies between about 10 MHz and 80 MHz (e.g., 13.56 MHz). Likewise, RF power supplies and matching networks may be operated at any suitable power to form plasma. Examples of suitable powers include, but are not limited to, powers between about 100 W and 3000 W for a high-frequency plasma and powers between about 100 W and 10000 W for a low-frequency plasma (on a per wafer basis). The RF power supply may be operated at any suitable duty cycle. Examples of suitable duty cycles include, but are not limited to, duty cycles of between about 5% and 90%. Acceptable process pressures are between about 0.5-5 Torr and preferably about 2-4 Torr.

In the depicted baseline process, the cycles of dielectric deposition and intermittent dopant delivery (operations A through G) may be performed multiple times as shown in a phase H of the figure. The actual number of times that the process sequence is repeated depends upon the desired total thickness of the film and the thickness of the dielectric deposited per cycle, as well as the amount of dopant incorporated into the film. In some embodiments, operations A-G are repeated at least twice, or at least three times, or at least five times, or at least about ten times.

After the dielectric film is completely deposited, it may be further processed to impart desired physical or chemical properties appropriate for the fabrication technology for which it is used. This may involve, for example, etching the deposited film on a device structure as depicted at an operation I of FIG. 16. In various embodiments, the etching is a wet etching process.

Numerous variations on this baseline process may be realized. Some of these variations have as their goal controlling or tuning the amount of dopant species in the dielectric film. Specific variations are designed to control the wet etch rate of the dielectric film. Other variations are designed to control the within wafer dopant uniformity, step-coverage (e.g., about 70-100%), dielectric constant (e.g., about 2.5-10), film leakage, refractive index, etc. For example, increased carbon dopant may decrease dielectric constant, reduce wet etch rate, and increase refractive index.

In certain embodiments, the cycle frequency with which a dopant is introduced into a growing dielectric film is controlled. More frequent dopant species delivery cycles result in an overall greater level of doping in the final dielectric film. This may also result in a relatively even distribution of dopant throughout the film. When fewer dopant precursor delivery cycles are inserted into the deposition process, the regions of high dopant concentration in the film are more widely separated than is the case when the dopant delivery cycles are more frequent.

In one embodiment, the dopant species is delivered to the growing dielectric film one time for each cycle of dielectric deposition. In another embodiment, the dopant species is delivered once during every other cycle of dielectric deposition. In other embodiments, less frequent dopant species delivery cycles are incorporated in the process. For example, the dopant species may be delivered once during every third, fourth, or fifth cycle of dielectric deposition. In some cases, the dopant species is delivered at a frequency of about once during every 5-20 dielectric deposition cycles.

It should be understood that the frequency of the dopant delivery cycles need not be consistent over the course of the dielectric film deposition. With this in mind, the resulting dielectric film may have a graded composition of dopant such that the average concentration of dopant over the thickness of the deposit dielectric film is nonuniform. In one embodiment, the concentration of dopant is greater on one side or the other of the dielectric film. Of course, the dopant concentration gradient in the dielectric film can be tailored as desired by carefully varying the frequency of dopant delivery cycles over the course of the entire dielectric deposition process.

Another variation on the baseline process involves adjusting the amount of dopant species delivered during any dopant delivery cycle. The amount of dopant delivered during any given dopant delivery cycle will be determined by the concentration of dopant species delivered to the reaction chamber as well as the duration of the exposure of the substrate to the delivered dopant species. Of course, if accumulation of dopant species is a surface limited process, as with ALD, the total amount of dopant delivered is somewhat constrained. To the extent that greater amounts of dopant species are delivered during any dopant delivery cycle, the overall concentration of dopant in the dielectric film increases. This may offset the effect of having relatively infrequent dopant delivery cycles in the overall process. However, it must be understood that increasing the amount of dopant delivered during any given dopant species delivery cycle results in a relatively high local concentration of dopant in the film. Of course, such dopant concentration spike can be softened by annealing or other operation through which the dopant concentration is made more uniform in the dielectric film.

In the case of carbon being the dopant, the amount of hydrocarbon or other carbon containing species delivered during a typical dopant delivery cycle may provide between about $10^8$ and $10^{22}$ atoms per $cm^2$. In the case of nitrogen being the dopant, the amount of nitrogenous compound delivered during a typical dopant delivery cycle may provide between about $10^8$ and $10^{22}$ atoms per $cm^2$ In some embodiments, the amount of dopant species delivered in each dopant delivery cycle is not constant throughout the growth of the full dielectric film. Thus, the amount of dopant species delivered per cycle can be tailored to produce a desired dopant concentration gradient in the dielectric film. For example, it may be desirable to provide greater amounts of dopant species in those dopant delivery cycles that occur at locations in the dielectric film that are relatively close to the underlying device structure or, alternatively at locations that are relatively near the center or outer surface of the film.

In general, the concentration profile of the dopant in the dielectric film can be tailored as appropriate. In one embodiment, the dopant concentration spikes to a high level at the edge of the film adjacent to the structure to be doped. In some embodiments, the concentration increases and decreases intermittently throughout the film thickness.

The base oxide or nitride matrix in which the dopant species reside may itself be tailored to affect the properties of the final doped film. For example, the density and/or chemical composition of the oxide or nitride may be controlled to produce a desired impact on final film properties. In some approaches, the entire dielectric thickness possesses the same density or composition such that the tailored properties are invariant throughout the film thickness. In other approaches, the film properties are tailored such that one or more such properties vary across the film thickness. Examples include modulation of band-gap and tunneling capacity over the thickness.

The deposition temperature employed during formation of the dielectric film also influences the film properties. In general, it has been found that dielectric deposited at relatively low temperatures by CFD processing generally provides relatively low density films. Lower density films permit faster diffusion of dopants, higher etch rates, and other interesting properties. Examples of the relatively low temperatures associated with relatively low density films are temperatures in the range of about 100 to 450° C., or more specifically between about 200 to 250° C. Of course, these temperature ranges depend upon the choice of dielectric precursor and other deposition parameters. The temperatures presented here are associated with use of BTBAS or BDEAS as the dielectric precursor.

By contrast, dielectric deposited at relatively higher temperatures tends to have a relatively higher density. Using BTBAS as the dielectric precursor, relatively high temperatures associated with relatively low dopant diffusion rates are in the range of about 500 to 1200° C., or more specifically between about 800 to 950° C. Of course, these temperatures may be applied to other precursors.

In various embodiments, the deposition temperature is controlled by heating and/or cooling a pedestal or chuck that holds the substrate during CFD. Examples of suitable pedestals are described in U.S. patent application Ser. No. 12/435,890 (published application no. US-2009-0277472), filed May 5, 2009, and US patent application Ser. No. 13/086,010, filed Apr. 13, 2011, both of which are incorporated herein by reference in their entireties.

In certain embodiments, the substrate surface on which the dielectric film is to be formed is pretreated prior to deposition of the dielectric film. In one example, the pretreatment involves exposure to a plasma such as a reducing plasma. Such treatment may be appropriate when, for example, the substrate features to be doped contains silicon. Typically silicon contains a small quantity of native oxide which could be detrimental in later fabrication operations. In a specific embodiment, the substrate surface is pretreated with a reducing plasma such as an ammonia or hydrogen containing plasma. In some embodiments, the pretreatment reduces the defects in the underlying device structure. For example, a helium plasma may be employed to reduce charge trapping defects in the underlying material. A helium plasma treatment may be done in a variety of ways including: (1) alternating CFD cycles and He-plasma cycles or (2) X # of CFD cycles followed by a helium plasma cycle where X is between about 1-200 or (3) inclusion of helium flow during the RF plasma step. Alternative gases include argon, ammonia, nitrogen, neon, xenon, hydrogen. RF plasma power may range from about 100 W to 3000 W with flows ranging from about 500 sccm to 20,000 SLM.

In general, the process depicted in FIG. 16 may be modified so that some or all the dopant precursor is delivered to the substrate surface prior to the first dielectric deposition cycle. This is depicted in FIG. 18, which is discussed below.

In various embodiments, a partially fabricated dielectric film itself is pretreated with a plasma or other activating treatment prior to exposure to the dopant species. This serves to change the concentration of charge trapping defects in the film. Alternatively, or in addition, the process may be used to increase either positive or negative charge in a film thus leading to control over flat-band-voltage position ranging from about −40V to 30V. The process conditions presented above for treating the underlying structure prior to film deposition may be employed as well for treating the partially deposited film.

An optional post deposition anneal may be employed. After the source layer is formed (or during its formation), the film may be annealed. In certain embodiments, the anneal is performed at a temperature of between about 100 and 1200° C. for about 0.5 to 60 minutes, or between about 700 and 900° C. for about 1 to 5 minutes.

The dielectric film serving as a source of dopant species will have various characteristics. In various embodiments, the film thickness is between about 10 and 20,000 Angstroms. For thru-silicon vias, film thicknesses ranging from 500 to 20,000 Å may be appropriate. For transistor applications, film thicknesses ranging from 5 to 1000 Å may be appropriate. The average concentration of dopant atoms (or other dopant species) in the dielectric film depends upon various factors including the total amount of dopant species per unit surface area of the film as well as the application.

In various embodiments, a nitrogen-doped silicon carbide film has a density of between about 2.6-3.5. In certain embodiments, silicon oxycarbide and silicon oxynitride films have a density of between 1.6-3.0. Compositionally, Si:O:N films may contain between about 2-35 atomic % nitrogen and about 2-35 atomic % oxygen with the balance being all or substantially all silicon. Compositionally, Si:O:C films may contain between about 2-35 atomic % carbon and about 2-35 atomic % oxygen with the balance being all or substantially all silicon. Compositionally, Si:N:C films may contain between about 2-35 atomic % nitrogen and 2-35 atomic % carbon with the balance being all or substantially all silicon.

Various apparatus may be designed to deposit the doped dielectric films as described here. Generally, the apparatus will contain a process chamber for holding a substrate during deposition of the doped film. The process chamber will include one or more inlets for admitting process gases, including dielectric precursors, oxidants, carrier gases or inerts, dopant species and the like. In various embodiments, the apparatus will additionally include features for generating a plasma having properties suitable for creating the dielectric layer, incorporating dopant into the dielectric layer, treating the dielectric layer to modify the electrical, optical, mechanical, and/or chemical properties of the layer, and the like. Typically, the apparatus will include a vacuum pump or provisions for connecting to such pump. Still further, the apparatus will have a controller or controllers configured or designed for controlling the apparatus to accomplish the sequence of doped dielectric deposition operations described here. The controller may include instructions for controlling various features of the apparatus including the valving to deliver of process gases and to control pressure, the power supply for generating plasmas, and the vacuum source. The instructions may control the timing and sequence of the various operations. In various embodiments, the apparatus may have features as provided in the Vector™ family of deposition tools available from Novellus Systems of San Jose, Calif. Other features of suitable apparatus for depositing doped dielectric films are described elsewhere herein.

The substrate surface on which the dielectric source layer is formed may require a highly conformal deposition. In certain examples, the dielectric source film conformably coats features having an aspect ratio of between about 500:1 and 20:1 for TSV and DRAM applications. For logic technology, the films may be deposited on features having aspect ratios ranging from about 10:1 to 2:1. In some examples, the featured have widths of no greater than about 2 micrometer for TSV applications. And for logic, critical dimensions ranging from about 200 nm down to 5 nm may be appropriate. Doping using dielectric source layers of the types described herein will find particular application in devices formed according to the 45 nm technology node and beyond, including the 22 nm technology node, the 16 nm technology node, 11 nm, 7 nm, etc.

Doped CFD films have various applications including serving as etchable layers used at various stages in integrated circuit fabrication such as in transistor and/or self-aligned contacts fabrication. In certain embodiments, the etchable layer is a glass layer having tunable wet etching rates, where the etch rate is tunable by the level of doping. In other words, the level of doping is chosen to provide a pre-defined etch rate. In specific embodiments, the etchable layer is a silicate glass layer containing a dopant such as phosphorus, boron, or combinations thereof. Etch rates may range from about 5:1 to 0.5:1 with respect to a typical thermal oxide; the etch rate for such oxide is about 1.

Among the device structures that may be contacted with doped CFD layers of the types described herein are front end of line structures such as gate electrodes or back end of line features such as planarized metallization layers and liners for low k dielectrics used for intermetal dielectrics.

In certain embodiments, the carbon or nitrogen doped structures described herein can be used as gate spacers in which a conformal dielectric layer is first deposited over the gate structure and then isotropically etched to leave sidewall spacers.

Figure 17:
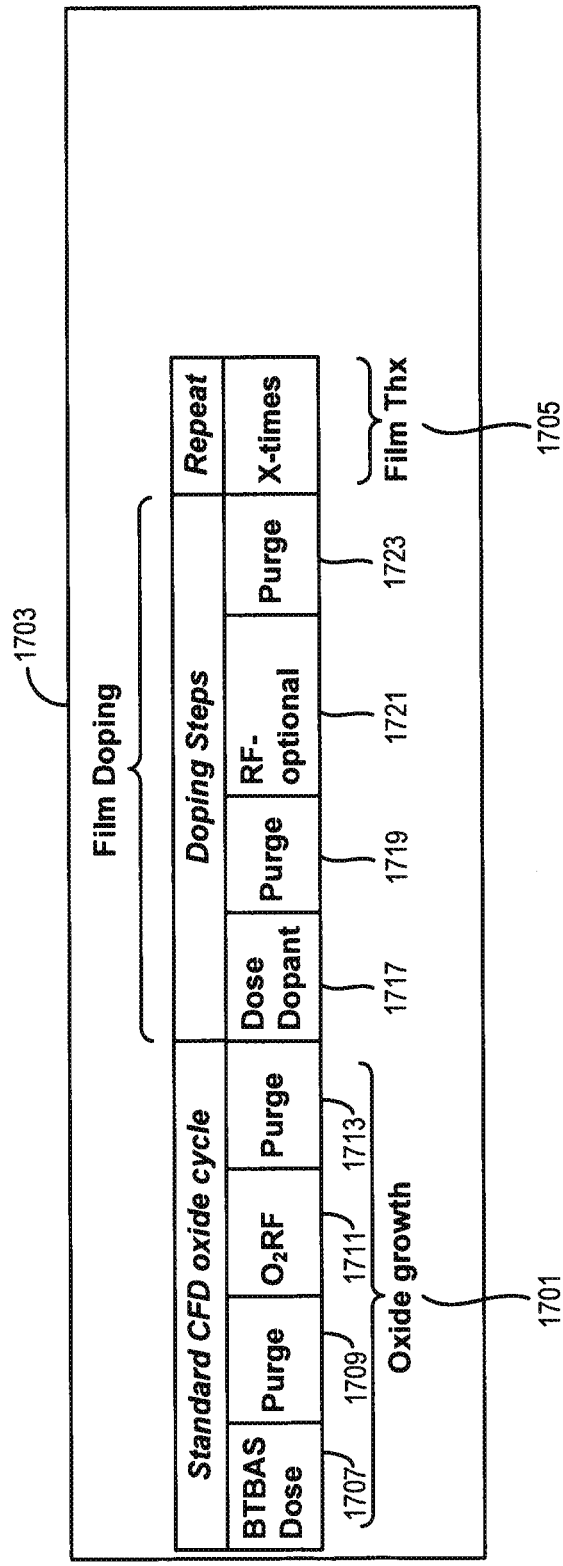
FIG. 17 presents a schematic depiction of a CFD pulse-train for the deposition of SiOC, SiON, and SiCN.

FIG. 17 presents a schematic depiction of a CFD pulse-train for the deposition of SiOC, SiON, and SiCN. As shown, there the process includes a CFD oxide film grown cycle 1701 and a film doping phase 1703. These are repeated as necessary to produce a film of appropriate thickness. See 1705. The CFD cycle 1701 begins with a BTBAS dose 1707, followed by a purge 1709, and then exposure to an RF plasma to drive the oxidation reaction 1711 of BTBAS, and finally a second purge 1713. Each of these 4 operations may be accompanied by delivery of oxygen. The film doping phase 1703 includes a dopant dose operation 1717, followed by a purge of the dopant species 1719, and then an optional RF plasma strike 1721 followed by a second purge 1723.

A specific example is depicted in the table presented in FIG. 18. The depicted example includes a pretreatment phase and a standard CFD oxide deposition phase. The CFD cycle follows the sequence shown in 1701 of FIG. 17. As shown, the pressure during the CFD cycles remains constant at 2 Torr throughout each operation (i.e., the BTBAS dose, the subsequent purge, the RF plasma activation, and the final purge. The first three of these operations are performed for 2 seconds each. The final purge is conducted for 1 second. Oxygen flows at 4 SLM and argon at 10 SLM during each of the 4 CFD operations. During the BTBAS dose, the precursor flows at 2 mL/minute. The plasma activation is conducted at 2500 W.

Of interest, this example begins with a pretreatment of the substrate, prior to beginning the first CFD cycle. The pretreatment begins with exposure to an RF plasma, followed by evacuation of the reaction chamber (optional pump to base), and finally a purge. The chamber pressure is initially 3 Torr and it holds at that level during the plasma treatment, then during the evacuation operation, the pressure drops to 0.2 Torr, and finally the pressure returns to 3 Torr during the purge. The duration of each operation is 1.8 seconds for the plasma treatment, 10 seconds for the pump to base, and 5 seconds for the purge. The plasma treatment is conducted at an energy of 200 or 500 W. Oxygen flows during the entire pretreatment sequence, first at 2 SLM during the plasma and pump down operations and then at 4 SLM during the purge (in preparation for the first CFD cycle). Argon flows at 5 SLM during the evacuation and purge operations. The plasma treatment may be accompanied by helium if the goal is to mitigate defects in the substrate or ammonia if the goal is provide nitrogen dopant. In either case, the gas flows at 7.5 SLM. In the latter case, the resulting dielectric is a nitrogen doped silicon oxide (SiON). The number of cycles may be tailored based on the desired films thickness. Typical deposition rates may vary from 0.4-1.4 A/cycle and typically 0.9-1.1 A/cycle. All processing may be done in any vacuum chamber and such as the Vector™ class of chambers (available from Novellus Systems, of San Jose, Calif.) for PECVD. Ammonia may be used as a co-reactant during the course of a deposition aimed toward generating SiON or SiCN films. The techniques and methods described herein are application to any wafer size including, though not limited to 200 mm, 300 mm, 450 mm.

Figure 13:
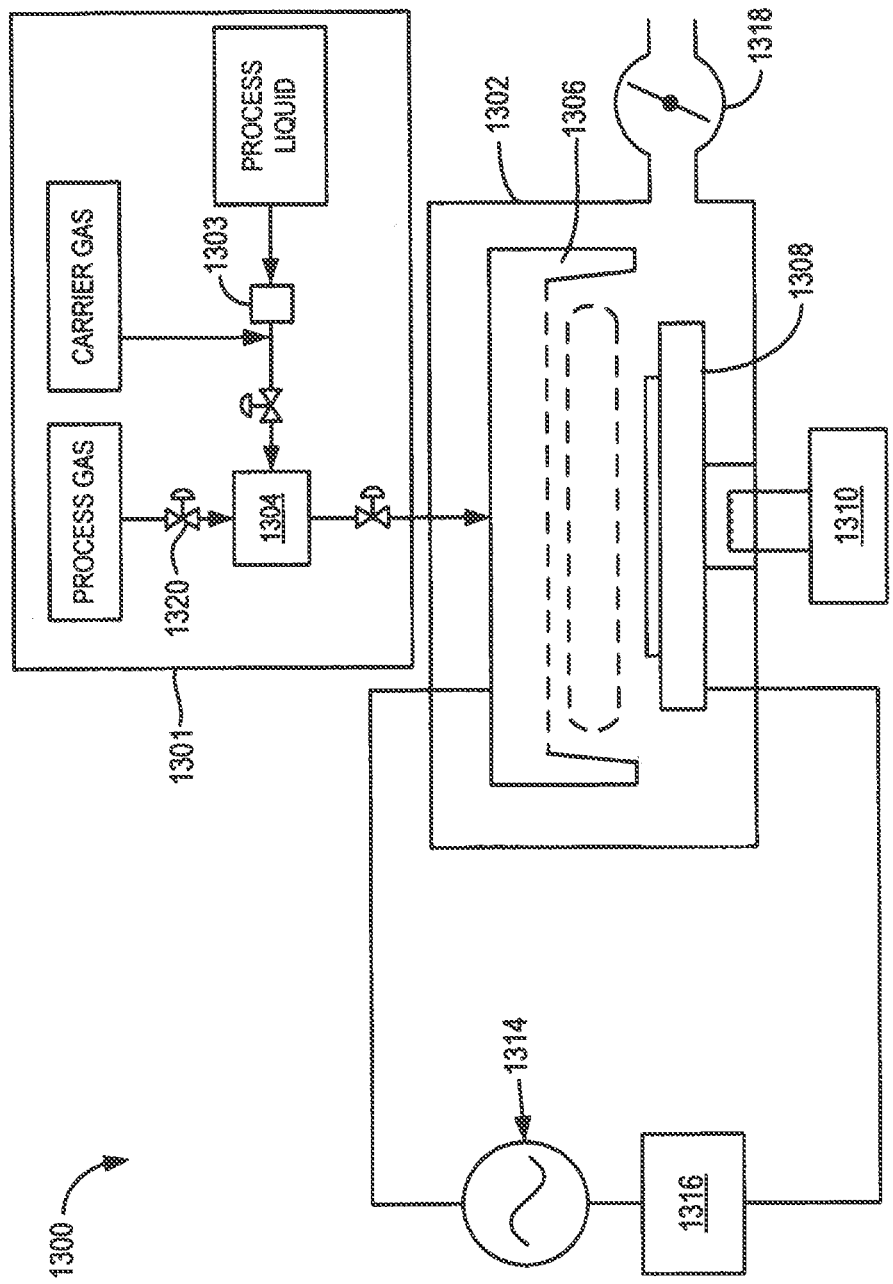
FIG. 13 schematically shows an example process station according to an embodiment of the present disclosure.
Figure 14:
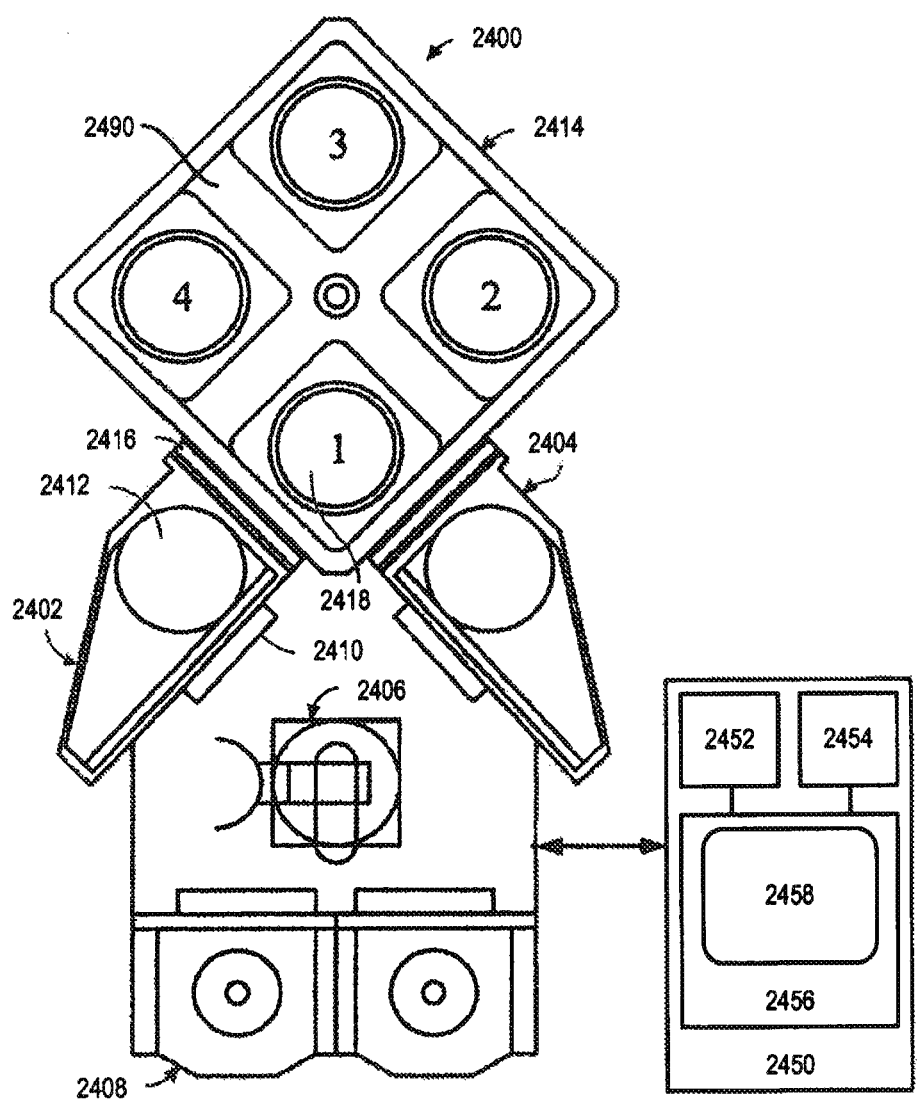
FIG. 14 schematically shows an example process tool including a plurality of process stations and a controller according to an embodiment of the present disclosure.

It will be appreciated that any suitable process station may be employed with one or more of the embodiments described above. For example, FIG. 13 schematically shows an embodiment of a CFD process station 1300. For simplicity, CFD process station 1300 is depicted as a standalone process station having a process chamber body 1302 for maintaining a low-pressure environment. However, it will be appreciated that a plurality of CFD process stations 1300 may be included in a common low-pressure process tool environment. While the embodiment depicted in FIG. 13 shows one process station, it will be appreciated that, in some embodiments, a plurality of process stations may be included in a processing tool. For example, FIG. 14 depicts an embodiment of a multi-station processing tool 2400. Further, it will be appreciated that, in some embodiments, one or more hardware parameters of CFD process station 1300, including those discussed in detail below, may be adjusted programmatically by one or more computer controllers.

CFD process station 1300 fluidly communicates with reactant delivery system 1301 for delivering process gases to a distribution showerhead 1306. Reactant delivery system 1301 includes a mixing vessel 1304 for blending and/or conditioning process gases for delivery to showerhead 1306. One or more mixing vessel inlet valves 1320 may control introduction of process gases to mixing vessel 1304.

Some reactants, like BTBAS, may be stored in liquid form prior to vaporization at and subsequent delivery to the process station. For example, the embodiment of FIG. 13 includes a vaporization point 1303 for vaporizing liquid reactant to be supplied to mixing vessel 1304. In some embodiments, vaporization point 1303 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 1303 may be heat traced. In some examples, mixing vessel 1304 may also be heat traced. In one non-limiting example, piping downstream of vaporization point 1303 has an increasing temperature profile extending from approximately 100 degrees Celsius to approximately 150 degrees Celsius at mixing vessel 1304.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 1303. In one scenario, a liquid injector may be mounted directly to mixing vessel 1304. In another scenario, a liquid injector may be mounted directly to showerhead 1306.

Showerhead 1306 and pedestal 1308 electrically communicate with RF power supply 1314 and matching network 1316 for powering a plasma. In some embodiments, the plasma energy may be controlled by controlling one or more of a process station pressure, a gas concentration, an RF source power, an RF source frequency, and a plasma power pulse timing. For example, RF power supply 1314 and matching network 1316 may be operated at any suitable power to form a plasma having a desired composition of radical species. Examples of suitable powers include, but are not limited to, powers between 100 W and 5000 W for a 300 mm wafer. Likewise, RF power supply 1314 may provide RF power of any suitable frequency. In some embodiments, RF power supply 1314 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, pedestal 1308 may be temperature controlled via heater 1310. Further, in some embodiments, pressure control for CFD process station 1300 may be provided by butterfly valve 1318. As shown in the embodiment of FIG. 13, butterfly valve 1318 throttles a vacuum provided by a downstream vacuum pump (not shown). However, in some embodiments, pressure control of process station 1300 may also be adjusted by varying a flow rate of one or more gases introduced to CFD process station 1300.

As described above, one or more process stations may be included in a multi-station processing tool. FIG. 14 shows a schematic view of an embodiment of a multi-station processing tool 2400 with an inbound load lock 2402 and an outbound load lock 2404, either or both of which may comprise a remote plasma source. A robot 2406, at atmospheric pressure, is configured to move wafers from a cassette loaded through a pod 2408 into inbound load lock 2402 via an atmospheric port 2410. A wafer is placed by the robot 2406 on a pedestal 2412 in the inbound load lock 2402, the atmospheric port 2410 is closed, and the load lock is pumped down. Where the inbound load lock 2402 comprises a remote plasma source, the wafer may be exposed to a remote plasma treatment in the load lock prior to being introduced into a processing chamber 2414. Further, the wafer also may be heated in the inbound load lock 2402 as well, for example, to remove moisture and adsorbed gases. Next, a chamber transport port 2416 to processing chamber 2414 is opened, and another robot (not shown) places the wafer into the reactor on a pedestal of a first station shown in the reactor for processing. While the embodiment depicted in FIG. 14 includes load locks, it will be appreciated that, in some embodiments, direct entry of a wafer into a process station may be provided.

The depicted processing chamber 2414 comprises four process stations, numbered from 1 to 4 in the embodiment shown in FIG. 14. Each station has a heated pedestal (shown at 2418 for station 1), and gas line inlets. It will be appreciated that in some embodiments, each process station may have different or multiple purposes. For example, in some embodiments, a process station may be switchable between a CFD and PECVD process mode. Additionally or alternatively, in some embodiments, processing chamber 2414 may include one or more matched pairs of CFD and PECVD process stations. While the depicted processing chamber 2414 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 14 also depicts an embodiment of a wafer handling system 2490 for transferring wafers within processing chamber 2414. In some embodiments, wafer handling system 2490 may transfer wafers between various process stations and/or between a process station and a load lock. It will be appreciated that any suitable wafer handling system may be employed. Non-limiting examples include wafer carousels and wafer handling robots. FIG. 14 also depicts an embodiment of a system controller 2450 employed to control process conditions and hardware states of process tool 2400. System controller 2450 may include one or more memory devices 2456, one or more mass storage devices 2454, and one or more processors 2452. Processor 2452 may include a CPU or computer, analog and/or digital input/output connections, stepper motor controller boards, etc.

In some embodiments, system controller 2450 controls all of the activities of process tool 2400. System controller 2450 executes system control software 2458 stored in mass storage device 2454, loaded into memory device 2456, and executed on processor 2452. System control software 2458 may include instructions for controlling the timing, mixture of gases, chamber and/or station pressure, chamber and/or station temperature, wafer temperature, target power levels, RF power levels, substrate pedestal, chuck and/or susceptor position, and other parameters of a particular process performed by process tool 2400. System control software 2458 may be configured in any suitable way. For example, various process tool component subroutines or control objects may be written to control operation of the process tool components necessary to carry out various process tool processes. System control software 2458 may be coded in any suitable computer readable programming language.

In some embodiments, system control software 2458 may include input/output control (IOC) sequencing instructions for controlling the various parameters described above. For example, each phase of a CFD process may include one or more instructions for execution by system controller 2450. The instructions for setting process conditions for a CFD process phase may be included in a corresponding CFD recipe phase. In some embodiments, the CFD recipe phases may be sequentially arranged, so that all instructions for a CFD process phase are executed concurrently with that process phase.

Other computer software and/or programs stored on mass storage device 2454 and/or memory device 2456 associated with system controller 2450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 2418 and to control the spacing between the substrate and other parts of process tool 2400.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with system controller 2450. The user interface may include a display screen, graphical software displays of the apparatus and/or process conditions, and user input devices such as pointing devices, keyboards, touch screens, microphones, etc.

In some embodiments, parameters adjusted by system controller 2450 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 2450 from various process tool sensors. The signals for controlling the process may be output on the analog and digital output connections of process tool 2400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 2450 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

What is claimed is:

1. A method of depositing a nitrogen and/or carbon doped dielectric film stack on a substrate surface in a reaction chamber, the method comprising:
   depositing a first dielectric portion of the dielectric film stack by a process comprising two or more cycles of dielectric deposition, each cycle comprising:
   (a) introducing a dielectric film precursor into the reaction chamber under conditions allowing the precursor to adsorb onto the substrate surface;
   (b) thereafter purging at least some unadsorbed precursor from the reaction chamber while some precursor remains adsorbed on the substrate surface;
   (c) exposing the substrate surface to plasma to drive a reaction of the dielectric film precursor adsorbed on the substrate surface to form a portion of the dielectric film stack;
   forming a first nitrogen and/or carbon rich portion of the dielectric film stack after depositing the first dielectric portion, by a process comprising:
   (d) introducing a carbon and/or nitrogen-containing dopant species, not introduced during (a)-(c), into the reaction chamber under conditions allowing the dopant species to contribute nitrogen and/or carbon to the partially-formed dielectric film stack;
   depositing a second dielectric portion of the dielectric film stack after forming the first nitrogen and/or carbon rich portion, by a process comprising two or more cycles of dielectric deposition, each cycle comprising (a)-(c); and
   forming a second nitrogen and/or carbon rich portion of the dielectric film stack after depositing the second dielectric portion, by a process comprising (d);
   wherein after deposition of the dielectric film stack, the nitrogen and/or carbon concentration in any of the first or second nitrogen and/or carbon rich portions of the stack is greater than the nitrogen and/or carbon concentration in any of the first or second dielectric portions of the stack and wherein nitrogen and/or carbon is present in each of the first and second dielectric portions of the stack.

2. The method of claim 1, further comprising flowing an oxidant into the reaction chamber prior to and during the two or more cycles of dielectric deposition comprising (a)-(c) for depositing the first and second dielectric portions of the dielectric film stack.

3. The method of claim 2, wherein during (a) the dielectric film precursor and the oxidant co-exist in vapor phase in the reaction chamber and wherein during (a) and (b) the precursor and the oxidant do not appreciably react with one another in the reaction chamber until exposure to plasma in (c).

4. The method of claim 2, wherein the oxidant is nitrous oxide.

5. The method of claim 1, wherein the processes for forming the first and second nitrogen and/or carbon rich portions of the dielectric film stack further comprise:
(e) reacting the carbon and/or nitrogen-containing dopant species to contribute nitrogen and/or carbon to the partially-formed dielectric film stack.

6. The method of claim 5, wherein (e) further comprises exposing the carbon and/or nitrogen-containing dopant species to a plasma.

7. The method of claim 1, further comprising exposing the substrate surface to the carbon and/or nitrogen-containing dopant species prior to performing (a) to deposit the first dielectric portion of the dielectric film stack.

8. The method of claim 1, wherein the processes for depositing the first and second dielectric portions of the dielectric film stack each comprise three or more cycles of dielectric film deposition, each cycle comprising (a)-(c).

9. The method of claim 1, wherein the dielectric film precursor is selected from the group consisting of dichlorosilane, BTBAS and BDEAS.

10. The method of claim 1, wherein the carbon and/or nitrogen-containing dopant species is selected from the group consisting of hydrocarbons, alcohols, ketones, aldehydes, ethers, esters, carboxylic acids, oxolanes, and furans.

11. The method of claim 10, wherein the carbon and/or nitrogen-containing dopant species is selected from the group consisting of methane, ethane, propane, acetylene, ethylene, propylene, t-amyl alcohol, ethanol, propanol, ethyleneglycol, and propyne.

12. The method of claim 1, wherein the carbon and/or nitrogen-containing dopant species is selected from the group consisting of ammonia, amines, nitriles, amides, nitrogen-containing heterocyclic compounds, and amino alcohols.

13. The method of claim 12, wherein the carbon and/or nitrogen-containing dopant species is selected from the group consisting of ammonia, hydrazine, elemental nitrogen, acetonitrile, t-butylamine, ethanolamine, ethylamine, and triethylamine.

14. The method of claim 1, wherein the amount of film deposited during one cycle of dielectric deposition (a)-(c) is between about 0.5 to 5 Angstroms.

15. The method of claim 1, wherein the total film thickness is between about 10-20000 Angstroms.

16. The method of claim 1, wherein the substrate is held at a temperature of between about 100° C. and 350° C. during (a)-(c) and (d).

17. The method of claim 1, wherein the dielectric film is silicon oxide doped with nitrogen, and wherein the concentration of oxygen in the dielectric film is between about 2-35 atomic percent and wherein the concentration of nitrogen in the dielectric film is between about 2-35 atomic percent.

18. The method of claim 1, wherein the dielectric film is silicon oxide doped with carbon, and wherein the concentration of oxygen in the dielectric film is between about 2-35 atomic percent and wherein the concentration of carbon in the dielectric film is between about 2-35 atomic percent.

19. The method of claim 1, further comprising:
applying photoresist to the substrate surface;
exposing the photoresist to light;
patterning the photoresist and transferring the pattern to the substrate surface; and
selectively removing the photoresist from the substrate surface.

20. The method of claim 1, wherein:
forming the first nitrogen and/or carbon rich portion of the dielectric film stack further comprises one or more cycles of dielectric deposition performed prior to (d), each cycle comprising (a)-(c); and
forming the second nitrogen and/or carbon rich portion of the dielectric film stack further comprises one or more cycles of dielectric deposition performed prior to (d), each cycle comprising (a)-(c).

21. The method of claim 1, further comprising:
depositing a third dielectric portion of the dielectric film stack after depositing the second nitrogen and/or carbon rich portion, by a process comprising two or more cycles of dielectric deposition, each cycle comprising (a)-(c); and
forming a third nitrogen and/or carbon rich portion of the dielectric film stack after depositing the third dielectric portion, by a process comprising (d);
wherein after deposition of the dielectric film stack, the nitrogen and/or carbon concentration in any of the first, second, or third nitrogen and/or carbon rich portions of the stack is greater than the nitrogen and/or carbon concentration in any of the first, second, or third dielectric portions of the stack.

22. The method of claim 21, wherein:
forming the first nitrogen and/or carbon rich portion of the dielectric film stack further comprises one or more cycles of dielectric deposition performed prior to (d), each cycle comprising (a)-(c);
forming the second nitrogen and/or carbon rich portion of the dielectric film stack further comprises one or more cycles of dielectric deposition performed prior to (d), each cycle comprising (a)-(c); and
forming the third nitrogen and/or carbon rich portion of the dielectric film stack further comprises one or more cycles of dielectric deposition performed prior to (d), each cycle comprising (a)-(c).

23. The method of claim 21, further comprising:
depositing a fourth dielectric portion of the dielectric film stack after depositing the third nitrogen and/or carbon rich portion, by a process comprising two or more cycles of dielectric deposition, each cycle comprising (a)-(c); and
forming a fourth nitrogen and/or carbon rich portion of the dielectric film stack after depositing the fourth dielectric portion, by a process comprising (d);
wherein after deposition of the dielectric film stack, the nitrogen and/or carbon concentration in any of the first, second, third, or fourth nitrogen and/or carbon rich portions of the stack is greater than the nitrogen and/or carbon concentration in any of the first, second, third, or fourth dielectric portions of the stack.

24. The method of claim 23, wherein:
forming the first nitrogen and/or carbon rich portion of the dielectric film stack further comprises one or more cycles of dielectric deposition performed prior to (d), each cycle comprising (a)-(c);
forming the second nitrogen and/or carbon rich portion of the dielectric film stack further comprises one or more cycles of dielectric deposition performed prior to (d), each cycle comprising (a)-(c);
forming the third nitrogen and/or carbon rich portion of the dielectric film stack further comprises one or more cycles of dielectric deposition performed prior to (d), each cycle comprising (a)-(c); and forming the fourth nitrogen and/or carbon rich portion of the dielectric film stack further comprises one or more cycles of dielectric deposition performed prior to (d), each cycle comprising (a)-(c).

25. An apparatus for depositing a nitrogen and/or carbon doped dielectric film stack on a substrate surface, the apparatus comprising:
a reaction chamber comprising a device for holding the substrate during deposition of the doped dielectric film;
one or more process gas inlets coupled to the reaction chamber; and
a controller designed or configured to cause the apparatus to perform the following operations:
depositing a first dielectric portion of the dielectric film stack by a process comprising two or more cycles of dielectric deposition, each cycle comprising:
(a) introducing a dielectric film precursor into the reaction chamber under conditions allowing the precursor to adsorb onto the substrate surface;
(b) thereafter purging at least some unadsorbed precursor from the reaction chamber while some precursor remains adsorbed on the substrate surface;
(c) exposing the substrate surface to plasma to drive a reaction of the dielectric film precursor adsorbed on the substrate surface to form a portion of the dielectric film stack;
forming a first nitrogen and/or carbon rich portion of the dielectric film stack after depositing the first dielectric portion, by a process comprising:
(d) introducing a carbon and/or nitrogen-containing dopant species, not introduced during (a)-(c), into the reaction chamber under conditions allowing the dopant species to contribute nitrogen and/or carbon to the partially-formed dielectric film stack;
depositing a second dielectric portion of the dielectric film stack after forming the first nitrogen and/or carbon rich portion, by a process comprising two or more cycles of dielectric deposition, each cycle comprising (a)-(c); and
forming a second nitrogen and/or carbon rich portion of the dielectric film stack after depositing the second dielectric portion, by a process comprising (d);
wherein after deposition of the dielectric film stack, the nitrogen and/or carbon concentration in any of the first or second nitrogen and/or carbon rich portions of the stack is greater than the nitrogen and/or carbon concentration in any of the first or second dielectric portions of the stack and wherein nitrogen and/or carbon is present in each of the first and second dielectric portions of the stack.

26. The apparatus of claim 25, wherein the controller is further designed or configured to cause the apparatus to flow an oxidant into the reaction chamber prior to and during the two or more cycles of dielectric deposition comprising (a)-(c) for depositing the first and second dielectric portions of the dielectric film stack.

27. The apparatus of claim 26, wherein the controller is further designed or configured to cause the dielectric film precursor and the oxidant to co-exist in vapor phase in the reaction chamber during (a).

28. The apparatus of claim 26, wherein the oxidant is nitrous oxide.

29. The apparatus of claim 25, wherein the controller is further designed or configured such that the processes for forming the first and second nitrogen and/or carbon rich portions of the dielectric film stack further comprise:
(e) reacting the carbon and/or nitrogen-containing dopant species to contribute nitrogen and/or carbon to the partially-formed dielectric film stack.

30. The apparatus of claim 29, further comprising a power source for generating a plasma, and wherein (e) further comprises exposing the carbon and/or nitrogen-containing dopant species to a plasma.

31. The apparatus of claim 25, wherein the controller is further designed or configured to cause exposure of the substrate surface to the carbon and/or nitrogen-containing dopant species prior to performing (a) to deposit the first dielectric portion of the dielectric film stack.

32. The apparatus of claim 25, wherein the controller is further designed or configured such that the processes for depositing the first and second dielectric portions of the dielectric film stack each comprise three or more cycles of dielectric film deposition, each cycle comprising (a)-(c).

33. The apparatus of claim 25, wherein the dielectric film precursor is selected from the group consisting of dichlorosilane, BTBAS and BDEAS.

34. The apparatus of claim 25, wherein the carbon and/or nitrogen-containing dopant species is selected from the group consisting of hydrocarbons, alcohols, ketones, aldehydes, ethers, esters, carboxylic acids, oxolanes, and furans.

35. The apparatus of claim 34, wherein the carbon and/or nitrogen-containing dopant species is selected from the group consisting of methane, ethane, propane, acetylene, ethylene, propylene, t-amyl alcohol, ethanol, propanol, ethyleneglycol, and propyne.

36. The apparatus of claim 25, wherein the carbon and/or nitrogen-containing dopant species is selected from the group consisting of ammonia, amines, nitriles, amides, nitrogen-containing heterocyclic compounds, and amino alcohols.

37. The apparatus of claim 36, wherein the carbon and/or nitrogen-containing dopant species is selected from the group consisting of ammonia, hydrazine, elemental nitrogen, acetonitrile, t-butylamine, ethanolamine, ethylamine, and triethylamine.

38. The apparatus of claim 25, wherein the controller is further designed or configured to cause the amount of film deposited during one cycle of dielectric deposition (a)-(c) to be between about 0.5 to 5 Angstroms.

39. The apparatus of claim 25, wherein the controller is further designed or configured to cause the total film thickness to be between about 10-20000 Angstroms.

40. The apparatus of claim 25, wherein the controller is further designed or configured to cause the substrate to be held at a temperature of between about 100° C. and 350° C. during (a)-(c) and (d).

41. A system comprising the apparatus of claim 25 and a stepper.

42. The apparatus of claim 25, wherein the controller is further designed or configured such that
forming the first nitrogen and/or carbon rich portion of the dielectric film stack further comprises one or more cycles of dielectric deposition performed prior to (d), each cycle comprising (a)-(c); and
forming the second nitrogen and/or carbon rich portion of the dielectric film stack further comprises one or more cycles of dielectric deposition performed prior to (d), each cycle comprising (a)-(c).

43. The apparatus of claim 25, wherein the controller is further designed or configured to cause the apparatus to perform the following additional operations:
- depositing a third dielectric portion of the dielectric film stack after forming the second nitrogen and/or carbon rich portion, by a process comprising one or more cycles of dielectric deposition, each cycle comprising (a)-(c); and
- forming a third nitrogen and/or carbon rich portion of the dielectric film stack after depositing the third dielectric portion, by a process comprising (d);

wherein after deposition of the dielectric film stack, the nitrogen and/or carbon concentration in any of the first, second, or third nitrogen and/or carbon rich portions of the stack is greater than the nitrogen and/or carbon concentration in any of the first, second, or third dielectric portions of the stack.

44. The apparatus of claim 43, wherein the controller is further designed or configured such that:
- forming the first nitrogen and/or carbon rich portion of the dielectric film stack further comprises one or more cycles of dielectric deposition performed prior to (d), each cycle comprising (a)-(c);
- forming the second nitrogen and/or carbon rich portion of the dielectric film stack further comprises one or more cycles of dielectric deposition performed prior to (d), each cycle comprising (a)-(c); and
- forming the third nitrogen and/or carbon rich portion of the dielectric film stack further comprises one or more cycles of dielectric deposition performed prior to (d), each cycle comprising (a)-(c).

* * * * *